United States Patent
Li et al.

(10) Patent No.: US 8,524,612 B2
(45) Date of Patent: *Sep. 3, 2013

(54) PLASMA-ACTIVATED DEPOSITION OF CONFORMAL FILMS

(75) Inventors: Ming Li, West Linn, OR (US); Hu Kang, Tualatin, OR (US); Mandyam Sriram, Beaverton, OR (US); Adrien LaVoie, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/011,569

(22) Filed: Jan. 21, 2011

(65) Prior Publication Data

US 2012/0077349 A1   Mar. 29, 2012

Related U.S. Application Data

(63) Continuation-in-part of application No. 12/889,132, filed on Sep. 23, 2010, now Pat. No. 8,101,531.

(51) Int. Cl.
*H01L 21/31* (2006.01)
*H01L 21/469* (2006.01)
*H01L 21/44* (2006.01)

(52) U.S. Cl.
USPC ............ 438/762; 438/667; 438/778; 438/787

(58) Field of Classification Search
USPC ................ 438/667, 778, 762, 787, 785, 788, 438/792
See application file for complete search history.

(56) References Cited

U.S. PATENT DOCUMENTS

| | | | |
|---|---|---|---|
| 5,874,368 | A | 2/1999 | Laxman et al. |
| 5,932,286 | A | 8/1999 | Beinglass et al. |
| 6,270,572 | B1 | 8/2001 | Kim et al. |
| 6,391,803 | B1 | 5/2002 | Kim et al. |

(Continued)

FOREIGN PATENT DOCUMENTS

| | | |
|---|---|---|
| JP | 4-364320 | 8/2009 |
| KR | 10-2001-0111448 | 12/2001 |

(Continued)

OTHER PUBLICATIONS

U.S. Appl. No. 13/414,619, filed Mar. 7, 2012, entitled "Method for Depositing a Cholrine-Free Conformal Sin Film".

(Continued)

*Primary Examiner* — Chuong A. Luu
(74) *Attorney, Agent, or Firm* — Weaver Austin Villeneuve & Sampson LLP

(57) ABSTRACT

Embodiments related to depositing thin conformal films using plasma-activated conformal film deposition (CFD) processes are described herein. In one example, a method of processing a substrate includes, applying photoresist to the substrate, exposing the photoresist to light via a stepper, patterning the resist with a pattern and transferring the pattern to the substrate, selectively removing photoresist from the substrate, placing the substrate into a process station, and, in the process station, in a first phase, generating radicals off of the substrate and adsorbing the radicals to the substrate to form active species, in a first purge phase, purging the process station, in a second phase, supplying a reactive plasma to the surface, the reactive plasma configured to react with the active species and generate the film, and in a second purge phase, purging the process station.

18 Claims, 13 Drawing Sheets

(56) References Cited

U.S. PATENT DOCUMENTS

| | | | |
|---|---|---|---|
| 6,428,859 | B1 | 8/2002 | Chiang et al. |
| 6,468,924 | B2 | 10/2002 | Lee et al. |
| 6,528,430 | B2 | 3/2003 | Kwan et al. |
| 6,551,893 | B1 | 4/2003 | Zheng et al. |
| 6,576,053 | B1 | 6/2003 | Kim et al. |
| 6,632,478 | B2 | 10/2003 | Gaillard et al. |
| 6,645,574 | B1 | 11/2003 | Lee et al. |
| 6,723,595 | B2 | 4/2004 | Park |
| 6,743,738 | B2 | 6/2004 | Todd |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,962,876 | B2 | 11/2005 | Ahn et al. |
| 6,987,240 | B2 | 1/2006 | Jennings et al. |
| 7,001,844 | B2 | 2/2006 | Chakravarti et al. |
| 7,077,904 | B2 | 7/2006 | Cho et al. |
| 7,115,528 | B2 | 10/2006 | Vaartstra et al. |
| 7,122,222 | B2 | 10/2006 | Xiao et al. |
| 7,122,464 | B2 | 10/2006 | Vaarstra |
| 7,132,353 | B1 | 11/2006 | Xia et al. |
| 7,148,155 | B1 | 12/2006 | Tarafdar et al. |
| 7,151,039 | B2 | 12/2006 | Lee et al. |
| 7,205,187 | B2 | 4/2007 | Leith et al. |
| 7,223,649 | B2 | 5/2007 | Oh et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,314,835 | B2 | 1/2008 | Ishizaka et al. |
| 7,341,959 | B2 | 3/2008 | Brcka |
| 7,361,538 | B2 | 4/2008 | Luan et al. |
| 7,390,743 | B2 | 6/2008 | Shin |
| 7,419,888 | B2 | 9/2008 | Yang et al. |
| 7,435,454 | B2 | 10/2008 | Brcka |
| 7,435,684 | B1 * | 10/2008 | Lang et al. ............... 438/695 |
| 7,488,694 | B2 | 2/2009 | Kim et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,601,648 | B2 | 10/2009 | Chua et al. |
| 7,615,449 | B2 | 11/2009 | Chung et al. |
| 7,622,369 | B1 | 11/2009 | Lee et al. |
| 7,622,383 | B2 | 11/2009 | Kim et al. |
| 7,632,757 | B2 | 12/2009 | Matsuura |
| 7,633,125 | B2 | 12/2009 | Lu et al. |
| 7,638,170 | B2 | 12/2009 | Li |
| 7,645,484 | B2 | 1/2010 | Ishizaka |
| 7,651,729 | B2 | 1/2010 | Kim et al. |
| 7,651,959 | B2 | 1/2010 | Fukazawa et al. |
| 7,682,657 | B2 | 3/2010 | Sherman |
| 7,713,592 | B2 | 5/2010 | Nguyen et al. |
| 7,776,733 | B2 | 8/2010 | Hasegawa |
| 7,919,416 | B2 | 4/2011 | Lee et al. |
| 7,959,985 | B2 | 6/2011 | Ishizaka et al. |
| 8,101,531 | B1 * | 1/2012 | Li et al. ............... 438/788 |
| 2005/0159017 | A1 | 7/2005 | Kim et al. |
| 2007/0251444 | A1 | 11/2007 | Gros et al. |
| 2008/0242116 | A1 | 10/2008 | Clark |
| 2009/0148625 | A1 | 6/2009 | Yeom et al. |
| 2009/0155606 | A1 | 6/2009 | Yoon et al. |
| 2009/0163012 | A1 | 6/2009 | Clark et al. |
| 2009/0278224 | A1 * | 11/2009 | Kim et al. ............... 257/506 |
| 2010/0102417 | A1 | 4/2010 | Ganguli et al. |
| 2011/0014795 | A1 * | 1/2011 | Lee et al. ............... 438/761 |
| 2011/0086516 | A1 | 4/2011 | Lee et al. |
| 2011/0256726 | A1 | 10/2011 | LaVoie et al. |
| 2011/0256734 | A1 | 10/2011 | Hausmann et al. |
| 2011/0298099 | A1 * | 12/2011 | Lee et al. ............... 257/632 |
| 2012/0009802 | A1 | 1/2012 | LaVoie et al. |
| 2012/0028454 | A1 | 2/2012 | Swaminathan et al. |

FOREIGN PATENT DOCUMENTS

| | | |
|---|---|---|
| KR | 10-2004-0001036 | 1/2004 |
| KR | 10-2009-0057665 | 6/2009 |
| KR | 10-2009-0081396 | 7/2009 |
| WO | WO2011/130326 | 10/2011 |
| WO | WO2011/130397 | 10/2011 |
| WO | WO2012/040317 | 3/2012 |

OTHER PUBLICATIONS

U.S. Appl. No. 13/472,282, filed May 15, 2012, entitled "Methods for UV-Assisted Conformal Film Deposition".

US Office Action, dated Sep. 14, 2012, issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

PCT International Search Report and Written Opinion, dated Oct. 20, 2011, issued in PCT/US2011/032186.

PCT Invitation to Pay Additional Fees; Communication Re Partial International Search, dated Dec. 16, 2011, issued in PCT/US2011/032303.

PCT International Preliminary Report on Patentability dated Oct. 26, 2012, issued in PCT/US2011/032186.

PCT International Search Report and Written Opinion, dated Feb. 20, 2012, issued in PCT/US2011/032303.

PCT International Search Report and Written Opinion dated May 2, 2012 issued in Application No. PCT/US2011/052537.

Lee, Jong Ju, Low-impurity, highly conformal atomic layer deposition of titanium nitride using $NH_3$-Ar-$H_2$ plasma treatment for capacitor electrodes, Lawrence Berkeley National Laboratory, University of California, Berkeley, CA (2004).

"PlasmaPro," Oxford Instruments (2010).

Cecchi et al., "Ultra-thin conformal pore-sealing of low-k materials by plasma-assisted ALD," University of New Mexico, Albuquerque, NM, Sandia National Labs, Albuquerque, NM (2007).

Lee et al., "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, Microelectronic Engineering 80 (2005).

Plasma Enhanced Atomic Layer Deposition (PEALD), Website: http://www.asm.com/index.php?option=com_content&task=view&id=19&Itemid=161 (2010).

King, Sean W., "Plasma enhanced atomic layer deposition of $SiN_x$:H and $SiO_2$," J. Vac. Sci. Technol. A 29(4), Jul./Aug. 2011.

P.F. Man et al., "Elimination of Post-Release Adhesion in Microstructures Using Conformal Fluorocarbon Coatings," MEMS '96 Proceedings, IEEE Feb. 11-15, 1996, pp. 55-60.

S.V. Nguyen et al., Plasma-assist chemical vapor deposition of dielectric thin films for ULSI semiconductor circuits, IBM J.Res. Develop. vol. 43, No. 1.2, Jan./Mar. 1999, pp. 5-38.

* cited by examiner

PLASMA-ACTIVATED DEPOSITION OF CONFORMAL FILMS

This application is a continuation-in-part of U.S. patent application Ser. No. 12/889,132, titled "Plasma-Activated Deposition of Conformal Films" and filed Sep. 23, 2010 now U.S. Pat. No. 8,101,531, the entire disclosure of which is incorporated by reference herein for all purposes.

BACKGROUND

Various thin film layers for semiconductor devices may be deposited with atomic layer deposition (ALD), chemical vapor deposition (CVD), or plasma-enhanced chemical vapor deposition (PECVD) processes. Under some conditions, some ALD processes may be unable to saturate the substrate, leading to incomplete film deposition on the substrate, film islanding, and film thickness variation. Similarly, under some conditions, some CVD and PECVD processes may be mass transport limited, and may be unable to cover high-aspect ratio device structures.

Some approaches to address incomplete film deposition may include, in ALD processes, longer dosing times to saturate the substrate surface with film precursor, and in CVD and PECVD processes, lower pressures to enhance mass transfer efficiency. However, extending dosing times and/or operating at lower pressures may diminish process tool throughput, requiring the installation and maintenance of additional process tools to support a production line. Further, films produced by such approaches may have physical, chemical, or electrical characteristics that provide inadequate device performance.

SUMMARY

Accordingly, various embodiments of methods and hardware for depositing thin conformal films using plasma-activated conformal film deposition (CFD) processes are described herein. In one embodiment, a method for processing a substrate is described. For example, the method may comprise, applying photoresist to the substrate, exposing the photoresist to light via a stepper, patterning the resist with a pattern and transferring the pattern to the substrate, and selectively removing the photoresist from the substrate. The method may further comprise placing the substrate into a process station of a semiconductor processing apparatus. The method may further comprise, in the process station, in a first phase, generating precursor radicals off of a surface of the substrate, and adsorbing the precursor radicals to the surface to form surface active species. The method may further comprise, in a first purge phase in the process station, purging residual precursor from the process station. The method may further comprise, in a second phase in the process station, supplying a reactive plasma to the surface, the reactive plasma being configured to react with the surface active species and generate the thin conformal film. The method may further comprise, in a second purge phase in the process station, purging residual reactant from the process station.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
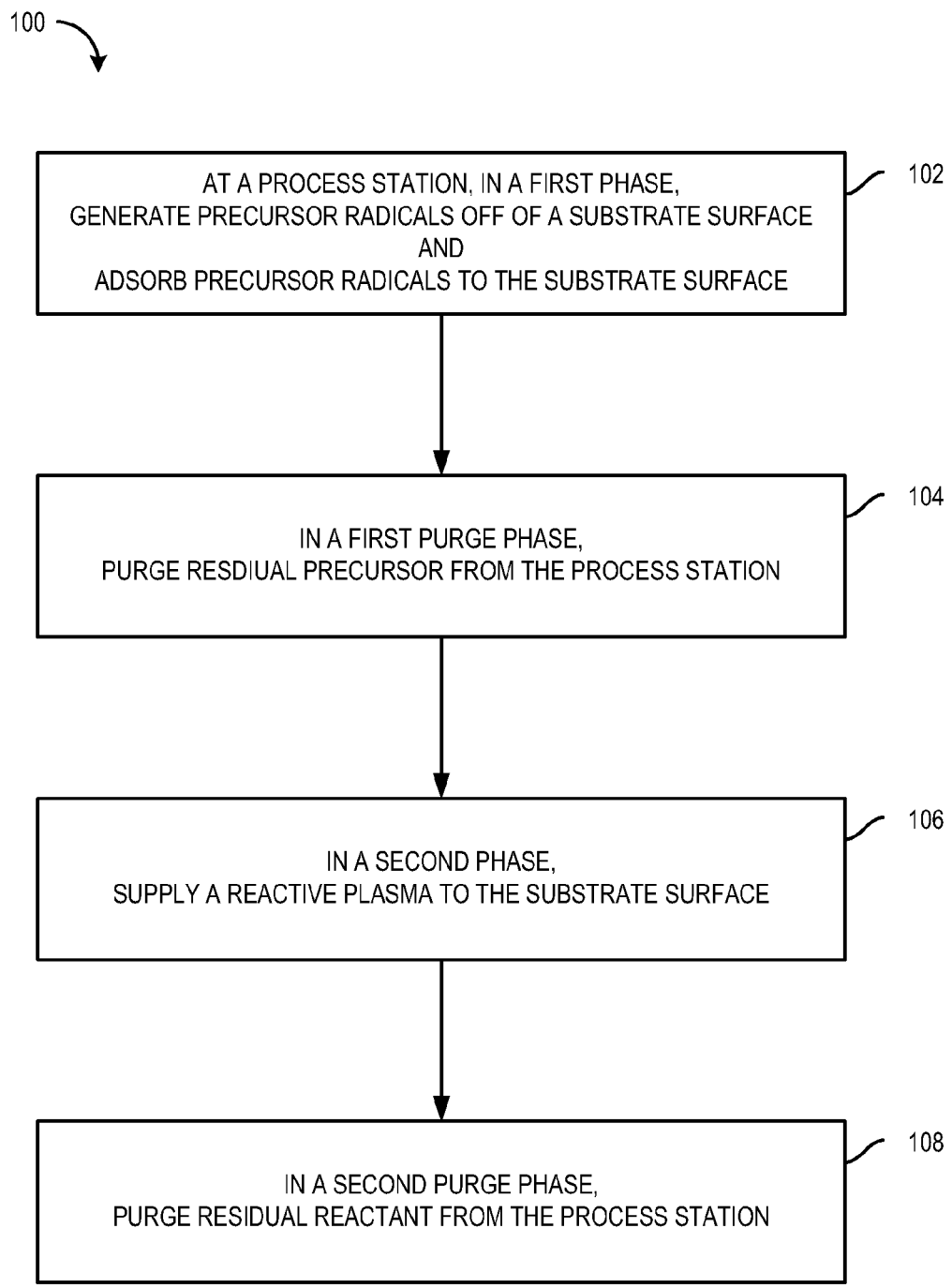
FIG. 1 shows a flowchart illustrating a method of depositing a thin conformal film using a plasma-activated conformal film deposition (CFD) process in accordance with an embodiment of the present disclosure.

Semiconductor devices are typically fabricated by depositing and patterning one or more thin films on a substrate, such as a silicon wafer, in an integrated manufacturing process. In some integrated processes it may be useful to deposit thin films that conform to substrate topography. For example, a dielectric film may be deposited onto the sidewalls and bottom of a trench etched into a silicon substrate. The dielectric film may electrically insulate the silicon substrate from material subsequently used to fill the trench and may physically isolate the substrate from the filler material.

Some approaches to depositing thin films include CVD, PECVD, and ALD deposition methods. CVD and PECVD approaches typically involve steady state gas phase or surface reactions between reacting species, the product of which is the deposited film. The thickness of the film increases in proportion to the reaction time. However, mass transport phenomena may also affect film thickness. For example, CVD processes may deposit a thicker film at the top of a trench than at the bottom of the trench. As deposition continues, the opening dimension of the top of the trench may become progressively smaller, reducing the ability of the gas phase to transport reactants and products within the trench. In some examples, a CVD process may be unable to deposit film at the bottom of a trench because the deposited film closes off the top of the trench. Further, because some devices may have regions of differing device density, mass transport effects may cause within-device and within-substrate thickness variation. This may degrade device performance and/or yield.

Some approaches to addressing these issues involve ALD. In contrast with CVD, where gas phase reactions are used to deposit films, ALD processes use surface-mediated deposition reactions to deposit films on a layer-by-layer basis.

In one example ALD process, a substrate surface is exposed to a gas phase film reactant P1. Some molecules of P1 may form a condensed phase atop the substrate surface, including chemisorbed and physisorbed P1. The reactor is then evacuated to remove gas phase and physisorbed P1, leaving chemisorbed P1 on the substrate surface. Subsequently, a second film reactant P2 is introduced to generate chemisorbed P2.

Thermal energy provided to the substrate activates surface reactions between chemisorbed P1 and P2, forming a film layer. Finally, the reactor is evacuated to remove reaction byproducts and unreacted P2, ending the ALD cycle. Additional ALD cycles may be included to build film thickness.

Because typical ALD reaction channels use surface-mediated thermal decomposition processes, low temperature ALD processes generally employ highly reactive chemicals. Such reactants may be functionalized to include leaving groups that are readily eliminated from the reactant. Because such leaving groups are readily cleaved from the parent molecule, the reactant may have a limited shelf-life and may readily decompose in supply and/or exhaust plumbing, potentially causing small particle defects. Further, synthesis of such chemicals may be expensive, potentially raising the cost of the device.

Depending on the exposure times and the sticking coefficients of P1 and P2, each ALD cycle may deposit, in theory, a monolayer of film. For example, one ALD cycle may deposit a layer of film of between one-half and three Angstroms thickness. Thus, ALD processes may be lengthy for films of more than a few nanometers thickness. Further, it may be difficult to saturating the surface where the one or more of the reactants has a low sticking coefficient, potentially wasting expensive chemicals and/or slowing film deposition.

Accordingly, embodiments are described herein for providing processes and equipment for plasma-activated CFD. For example, FIG. 1 shows a flowchart for an embodiment of a method 100 for deposting a thin conformal film using plasma-activated CFD.

Method 100 comprises, at 102, in a first phase, generating precursor radicals off of a surface of the substrate and adsorbing the precursor radicals to the surface to form surface active species. Continuing, method 100 comprises, at 104, in a first purge phase, purging residual precursor from the process station. Continuing, method 100 comprises, at 106, in a second phase, supplying a reactive plasma to the surface, the reactive plasma configured to react with the surface active species and generate the thin conformal film. Finally, method 100 comprises, at 108, in a second purge phase, purging residual reactant from the process station.

Figure 2:
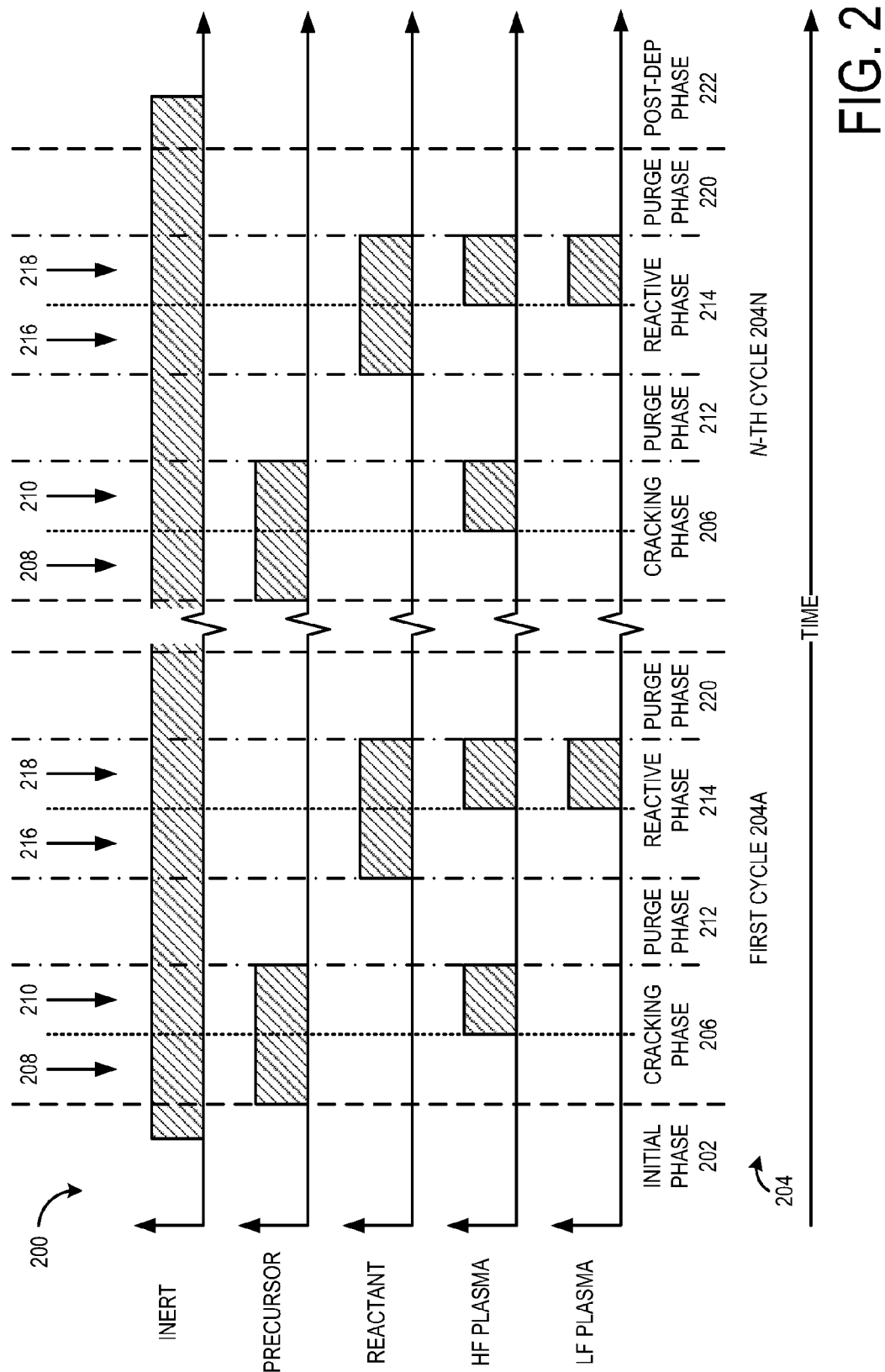
FIG. 2 shows an example plasma-activated CFD process timing diagram in accordance with an embodiment of the present disclosure.

FIG. 2 schematically shows a timing diagram 200 for an embodiment of method using plasma-activated CFD to deposit thin conformal films. The example depicted in FIG. 2 comprises an optional initial phase 202, a plurality of deposition cycles 204, and an optional post-deposition phase 222.

As shown in FIG. 2, timing diagram 200 comprises a series of process parameters arranged in a temporal sequence of process phases proceeding from left to right. However, it will be appreciated that the process phases may be arranged in any suitable sequence and that some phases may be omitted in some embodiments. Unlike the ALD process described above, plasma energy provided during a cracking phase 206 activates cracking of the film precursor. The gas phase precursor radicals formed during cracking phase 206 adsorb to the substrate surface, forming surface active species that may migrate to conform to the surface topography. Plasma energy provided during a reactive phase 214 activates one or more surface reactions of the surface active species, generating a thin conformal film.

The plasma-activated CFD process parameters shown in FIG. 2 include flow rates for inert, precursor, and reactant species in addition to power status settings for high-frequency (HF) and low-frequency (LF) plasmas. However, it will be appreciated that other plasma-activated CFD process parameters not shown in FIG. 2 may vary with time. Other example plasma-activated CFD process parameters include, but are not limited to, plasma power and frequency, substrate temperature, process station pressure, and various temperature and pressure conditions for process station feed and exhaust plumbing hardware.

The embodiment shown in FIG. 2 includes optional initial phase 202. If included, initial phase 202 may condition the process station and the substrate for substrate transfer into the process station and/or for subsequent deposition. For example, in some embodiments, initial phase 202 may include various pressure and temperature control routines to transition the substrate and/or the process station to film deposition conditions.

As shown in FIG. 2, initial phase 202 includes supplying one or more inert gases to the process station at a controlled rate. The inert gases may include various non-reactive gases, such as nitrogen, argon, helium, xenon, and carbon monoxide, individually or in any suitable mixture. Inert gases may desorb condensed water from the substrate surface. Controlling the flows of inert gases may control pressure and/or temperature within the process station. Various inert gases may also be used as carrier gases for transporting one or more precursors or reactants and as a diluent for the process station and the process station exhaust plumbing.

FIG. 2 shows that inert gases are supplied in each of the subsequent phases described in more detail below. For example, in some embodiments, inert gases may be supplied during a plasma activation phase to assist with igniting and/or supporting the plasma. However, it will be appreciated that, in some embodiments, inert gases may not be supplied during one or more phases, and that, in some embodiments, inert gases may be entirely omitted. Further, while the flow of the inert gases is constant as shown in FIG. 2, in some embodiments, the flow of inert gases may vary. For example, in some embodiments, increasing the flow of one or more inert gases may comparatively decrease the duration of a purge phase. In one scenario, the flow rate of inert gases may be adjusted according to various process gas thermodynamic characteristics and/or various geometric characteristics of the process station.

While the embodiment shown in FIG. 2 does not depict the use of a plasma during optional initial phase 202, it will be appreciated that in some embodiments, plasma energy may be used to treat the substrate surface prior to deposition. Such plasma treatment may clean the substrate surface, which may prepare the surface for deposition of the thin conformal film.

Next, the embodiment shown in FIG. 2 includes a plurality of deposition cycles 204. Specifically, FIG. 2 shows N deposition cycles 204 extending from a first deposition cycle 204 to an N-th deposition cycle 204N, where N is an integer representing any suitable number of deposition cycles 204 for building a film of a desired thickness. While FIG. 2 depicts a plurality of deposition cycles 204, in some embodiments, the plasma-activated CFD process may include a single deposition cycle 204.

Each deposition cycle 204 includes an instance of cracking phase 206. During cracking phase 206, precursor radicals are generated off of the substrate surface by a cracking plasma. In one scenario, precursor radicals may be generated in a plasma formed directly above the substrate surface. In another scenario, precursor radicals may be generated by a remote plasma and carried in the gas phase to the substrate surface. Once formed, the precursor radicals adsorb to the surface of the substrate, forming surface active species. The surface active species may then migrate on the substrate surface, potentially forming a substantially conformal adlayer of surface active species.

The precursor is supplied to the process station at a controlled rate during cracking phase 206. While the embodiment of method 100 shown in FIG. 2 depicts the precursor flow as having a constant flow rate, it will be appreciated that any suitable controlled flow of precursor to the process station may be employed within the scope of the present disclosure. In one additional example, precursor may be supplied in a variable flow rate. In addition to the presence of the precursor, the cracking plasma may include one or more non-reactive plasma gases, such as one or more of the inert gases described above.

In some embodiments, cracking phase 206 may be subdivided into two or more subphases. In the embodiment shown in FIG. 2, cracking phase 206 is divided into an optional pre-plasma precursor subphase 208 and a cracking plasma subphase 210. In some embodiments, cracking phase 206 may include two or more instances of cracking plasma subphase 210, which may be sequenced to form a pulsed-mode cracking plasma as described in more detail with respect to FIG. 6 below.

During optional pre-plasma precursor subphase 208, the precursor is supplied to the process station at a controlled rate before ignition of the plasma. If included in method 100, pre-plasma precursor subphase 208 may have any suitable duration. For example, in one scenario, pre-plasma precursor subphase 208 may be timed so that the flow rate of the precursor stabilizes within the process station prior to ignition of the plasma. This may avoid precursor flow instability during plasma radical generation. In another scenario, pre-plasma precursor subphase 208 may be timed to charge the process station to a desired partial pressure of precursor prior to ignition of the plasma. This may provide a desired concentration of precursor radicals once the plasma is ignited.

A cracking plasma is ignited during cracking plasma subphase 210. The cracking plasma is configured to crack the precursor molecule into precursor radicals. While the flow of precursor precedes the ignition of the cracking plasma in the example shown in FIG. 2, it will be appreciated that, in some embodiments, the cracking plasma may be ignited before precursor begins to flow to the process station. Cracking plasma subphase 210 may have any suitable duration without departing from the scope of the present disclosure.

In the embodiment shown in FIG. 2, the cracking plasma used during cracking plasma subphase 210 includes a high-frequency plasma configured to operate at 13.56 MHz or higher. Without wishing to be bound by theory, such high-frequency plasmas may be comparatively more effective at bond scission processes than lower frequency plasmas. However, it will be appreciated that any suitable plasma frequency may be employed, such as low-frequency plasma frequencies and dual-mode plasmas including high and low frequencies concurrently or in pulses. Further, any suitable plasma power density may be employed within the scope of the present disclosure. Example power densities include, but are not limited to, power densities in a range of 0.05-5 W/cm$^2$ as measured at the substrate surface.

In one example where the precursor includes tetraethyl orthosilicate ($C_8H_{20}O_4Si$, or TEOS), the cracking plasma may cleave one or more ethyl substituent groups from the parent molecule, so that $Et_xSiO_x$— species are adsorbed to the substrate surface. However, it will be appreciated that various precursor radicals may be formed. The identities of various precursor radicals formed may depend on process variables including, but not limited to, the identity of the precursor, the partial pressure of the precursor, the partial pressure of other plasma gases, the total pressure of the process station, the plasma power, and the plasma frequency. Further, the identities of the various precursor radicals formed may vary according to the thermodynamic and kinetic properties of the gas phase species.

The cracking plasma is extinguished at the end of cracking plasma subphase 210. While FIG. 2 shows extinction of the cracking plasma as concurrent with shutoff of the precursor flow, it will be appreciated that suitable non-concurrent shutoff of the precursor flow may be employed in some embodiments. For example, in one non-limiting scenario, precursor flow may be shut off prior to extinguishing the cracking plasma so that residual precursor may be activated and adsorbed to the surface.

In some embodiments, deposition cycle 204 may include a post-precursor purge phase 212 for removing residual from the process station. Purging the process station may avoid gas phase reactions between the precursor and the reactant supplied during the reactive phase. In the example shown in FIG.

2, the flow of inert gas is maintained during purge phase 212, purging the process station of residual precursor molecules. Post-precursor purge phase 212 may have any suitable duration.

In some embodiments, post-precursor purge phase 212 may include one or more evacuation subphases (not shown) for evacuating the process station, which may comparatively reduce the duration of post-precursor purge phase 212. Alternatively, it will be appreciated that post-precursor purge phase 212 may be omitted in some embodiments.

Each deposition cycle 204 includes an instance of reactive phase 214. During reactive phase 214, a reactive plasma generated from a suitable reactant delivers reactant radicals to the substrate surface. The reactant radicals interact with the surface active species and generate a thin conformal film. In some embodiments, reactive phase 214 may be subdivided into two or more subphases. In the embodiment shown in FIG. 2, reactive phase 214 is divided into an optional pre-plasma reactant subphase 216 and a reactive plasma subphase 218.

During optional pre-plasma reactant subphase 216, the reactant is supplied to the process station at a controlled rate. If included in method 100, pre-plasma reactant subphase 216 may have any suitable duration. For example, in one scenario, pre-plasma reactant subphase 216 may be timed so that the flow rate of the reactant stabilizes within the process station prior to ignition of the plasma. This may avoid reactant flow instability during plasma radical generation. In another scenario, pre-plasma reactant subphase 216 may be timed to charge the process station to a desired partial pressure of precursor prior to ignition of the plasma. This may provide a desired concentration of precursor radicals once the plasma is ignited.

A reactive plasma is ignited during reactive plasma subphase 218, generating reactive radical species. While the flow of reactant precedes the ignition of the reactive plasma in the example shown in FIG. 2, it will be appreciated that, in some embodiments, the reactive plasma may be ignited before reactant begins to flow to the process station. Reactive plasma subphase 218 may have any suitable duration without departing from the scope of the present disclosure.

The reactive radical species formed by the reactive plasma may adsorb to the surface of the substrate and diffuse through the adsorbed layer of surface active species. The reactive radicals species may react with the surface active species or may facilitate reaction between surface active species. For example, in a plasma-activated CFD process for depositing a thin conformal silicon oxide film from TEOS radicals and a reactive oxygen plasma, the reactive oxygen plasma may potentially oxidize surface adsorbed siloxy species (e.g., $Et_3O_3Si$, $Et_2O_2Si$, and $EtOSi$) to form silicon oxide, may facilitate cross-linking among $(O-Si-O)_x$ oligomers to extend a silicon oxide network, may fill oxygen vacancies in the silicon oxide lattice, and may oxidize ethyl groups.

The reactive plasma is extinguished at the end of reactive plasma subphase 218. While FIG. 2 shows extinction of the reactive plasma as concurrent with shutoff of the reactant flow, it will be appreciated that suitable non-concurrent shutoff of the reactant flow may be employed in some embodiments. For example, in one non-limiting scenario, reactant flow may be shut off prior to extinguishing the reactive plasma so that residual reactant may be activated and adsorbed to the surface.

In the embodiment shown in FIG. 2, the reactive plasma is formed by using a high-frequency plasma configured to operate at 13.56 MHz or higher and a low-frequency plasma configured to operate at less than 13.56 MHz. However, it will be appreciated that the selection of one or more plasma frequencies during reactive phase 214 may be based in part on one or more desired physical and/or electrical characteristics of the film. Further, in some embodiments, reactive phase 214 may include pulsed-mode reactive plasmas, as described in more detail with respect to FIG. 7 below.

As described above, high-frequency plasmas may be comparatively more effective in activating reactant bond scission processes than lower frequency plasmas. However, lower frequency plasmas may be comparatively more effective at providing a reactive plasma at the substrate surface. For example, a low-frequency plasma may generate a comparatively higher bombardment energy and have a comparatively higher sheath voltage. Without wishing to be bound by theory, in an example scenario where it is desirable to have a low wet etch rate for an oxide film, a low-frequency oxygen plasma may be used to deliver comparatively more oxygen to the substrate surface. This may provide a comparatively more dense film and more compressively stressed film. In another scenario where it is desirable to reduce carbon contamination in an oxide film, a high-frequency plasma may be used to generate a comparatively higher density of atomic oxygen. This may scavenge a comparatively greater amount of surface-bound carbon relative to a low-frequency plasma.

It will be appreciated that any suitable plasma power density may be employed in reactive plasma subphase 218 within the scope of the present disclosure. Example power densities include, but are not limited to, power densities in a range of 0.05-5 $W/cm^2$ as measured at the substrate surface.

In some embodiments, deposition cycle 204 may include a post-reactant purge phase 220. Residual reactant may be removed from the process station during post-reactant purge phase 220. Purging the process station may avoid gas phase reactions between the reactant and the precursor supplied during a subsequent deposition cycle 204. In the example shown in FIG. 2, the flow of the inert gas is maintained during post-reactant purge phase 220, purging the process station of residual reactant molecules. Post-reactant purge phase 220 may have any suitable duration. For example, in some embodiments, post-reactant purge phase 220 may be timed according to a residence time of the process station.

In some embodiments, post-reactant purge phase 220 may include one or more evacuation subphases (not shown) for evacuating the process station, which may comparatively reduce the duration of post-reactant purge phase 220. Alternatively, it will be appreciated that post-reactant purge phase 220 may be omitted in some embodiments.

In some embodiments, one or more optional post-deposition phases 222 may follow one or more deposition cycles 204 to condition the deposited film. For example, post-deposition phase 222 may provide various plasma and/or thermal treatments for the deposited film. Examples of film treatments provided during post-deposition phase 222 as will be described in detail with respect to FIG. 11. Because diffusion effects may define a depth beyond which the results of some plasma treatment processes are diminished, additional deposition cycles 204 may be appended after post-deposition phase 222 to build additional film thickness, followed by additional post-deposition phases 222, and so on.

In some embodiments, post-deposition phase 222 may condition the process station and the substrate for a substrate transfer process. For example, in some embodiments, post-deposition phase 222 may include various pressure and temperature control routines to transition the substrate and the process station to conditions suitable for transferring the substrate to another process station or to a load lock included in the process tool. As shown in FIG. 2, one or more inert gases are supplied during a portion of post-deposition phase 222. Supplying inert gas to the process station may provide pressure control within the process station in preparation for substrate transfer. While a constant supply of inert is shown in FIG. 2, it will be appreciated that any suitable flow rate scheme, including a variable flow rate scheme, may be employed in some embodiments. In some other embodiments, no inert may be supplied during post-deposition phase 222.

The method described above may be used to deposit various thin conformal films. In one non-limiting example, a plasma-activated CFD process may be used to deposit a silicon oxide film from a precursor including TEOS and a reactant including oxygen. Example process parameter ranges for example TEOS-based silicon oxide films are provided in Table 1.

It will be appreciated that any suitable precursor or precursors may be supplied to the process station during the cracking phase. Because the surface active species are formed through gas phase plasma cracking instead of surface-mediated thermal decomposition reactions as in an ALD process, multilayers of surface active species may be formed by extending the amount of precursor supplied during the cracking phase. This may provide faster film deposition relative to the monolayer-by-monolayer approach of typical ALD processes.

Non-limiting examples of precursors include Tetraethyl orthosilicate (TEOS) and analogues thereof (e.g., $Si(OR)_4$, where R may be any suitable alkyl group, such as a methyl group, an ethyl group, a propyl group, etc.); alkoxysilanes such as methyltriethoxysilane (MTEOS), methyltrimethoxysilane (MTMOS), dimethyldimethoxysilane (DMDMOS),

TABLE 1

| Parameter | TEOS Cracking Phase | | | Oxygen Reactive Phase | | |
|---|---|---|---|---|---|---|
| | Pre-plasma Subphase | TEOS Plasma Subphase | Post-Cracking Purge Phase | Pre-plasma Subphase | Oxygen Plasma Subphase | Post Reactive Purge Phase |
| Time (sec) | 0.25-2 | 0.25-2 | 0.25-4 | 0.25-2 | 0.25-2 | 1-6 |
| TEOS (ml) | 0.5-15 | 0.5-15 | 0 | 0 | 0 | 0 |
| $O_2$ (sccm) | 0 | 0 | 0 | 1000-25000 | 1000-25000 | 0 |
| Ar (sccm) | 5000-11000 | 5000-11000 | 8000-15000 | 3000-9000 | 3000-9000 | 10000-20000 |
| Pressure (torr) | 1-10 | 1-10 | 1-10 | 1-10 | 1-10 | 1-10 |
| Temp (° C.) | 25-550 | 25-550 | 25-550 | 25-550 | 25-550 | 25-550 |
| HF Power (W) | — | 200-2000 | 0 | — | 200-2000 | 0 |
| LF Power (W) | — | 0 | 0 | — | 200-2000 | 0 |

In this example, TEOS radicals generated by a cracking plasma adsorb to the substrate surface, forming surface active species. These surface active species form a substantially conformal layer of surface active species on the substrate. Example surface active species may include a variety of $(O—Si—O)_x$ oligomers arranged in a condensed phase. Some of these oligomers may include carbon from ethyl ligands.

After a purge phase removes residual TEOS from the process station, a reactive oxygen plasma supplies oxygen radicals to the substrate surface. For example, atomic oxygen may be supplied to the surface during the oxygen plasma phase. The oxygen radicals may diffuse through the conformal layer of surface active species, reacting with dangling bonds from silicon atoms, occupying empty lattice sites, and cross-linking the surface active species to form a conformal silicon oxide film. Oxygen radicals supplied by the reactive plasma may also oxidize and liberate surface adsorbed carbon liberated from TEOS. Non-limiting film property information for example $SiO_2$ films formed from TEOS and oxygen is provided in Table 2.

trimethylmethoxysilane (TMMOS), dimethyldiethoxysilane (DMDEOS); alkylsilanes such as Tetramethylsilane (4MS); Trimethylsilane (3MS); Dimethylsilane (2MS); cyclic siloxanes such as 2,4,6,8-Tetramethylcyclotetrasiloxane (TOMCAT), octamethylcyclotetrasiloxane (OMCAT), tetravinyltetramethylcyclotetrasiloxane (TVTMCTS); alkynylsilanes such as Trimethylsilylacetylene (TMSA); and mixtures of these precursors.

Similarly, any suitable reactant may be supplied during the reactive phase to form various films, including silicon oxides, silicon nitrides, silicon carbides, and silicon borides. Further, mixed films may be deposited by supplying appropriately mixed reactants during the reactive phase, and graded films may be deposited by varying an identity of a reactant or a composition of a reactant mixture across two or more deposition cycles. Thus, in addition to single films, the methods described herein may be used to form stacks of alternating films for antireflective layers or other suitable applications.

Non-limiting examples of reactants for forming silicon oxide films include $O_3$, $O_2$, $N_2O$, $NO_2$, $H_2O$, CO, and $CO_2$. Non-limiting examples of reactants for forming silicon

TABLE 2

| Dep. Temp. (° C.) | Dep. Rate (Å/cyc.) | Thick. (Å) | Range | | Ref. Index | | Stress (MPa) | k (Hg) | Leakage Current $(A/cm^2)$ | | | Breakdown Voltage (MV/cm) |
|---|---|---|---|---|---|---|---|---|---|---|---|---|
| | | | R (%) | 1σ (%) | RI | v (%) | | | @ 1 MV/cm | @ 2 MV/cm | @ 4 MV/cm | |
| 180 | 4.1 | 812 | 1.60 | 0.82 | 1.471 | 0.045 | −298 | 4.4 | 3.8E−10 | 1.2E−9 | 2.6E−9 | −12.3 |
| | 4.0 | 7692 | 2.87 | 1.59 | 1.466 | 0.037 | −290 | 4.6 | 4.0E−9 | 4.8E−9 | | |
| 400 | 2.6 | 517 | 2.76 | 1.81 | 1.485 | 0.076 | −300 | 4.0 | 1.5E−9 | 1.4E−9 | 6.3E−10 | −10.6 | nitride films include $N_2$, $NH_3$, $N_2O$, $NO_2$, $N_2H_2$, MeN=NMe, $H_2N$—$NH_2$, $N(Me)_3$, $N(Et)_3$, and $NH_2(t$-Bu$)$. Non-limiting examples of reactants for forming silicon carbide films include amines (primary, secondary, tertiary), CO, $CO_2$, methane, ethane, propane, ethylene, propylene, and ethyne. Non-limiting examples of reactants for forming silicon boride films include $BH_3$, $B_2H_6$, borane-N,N-diisopropylamine, borane-trimethylamine, borane-diethylamine, borane-pyridine, borane-t-butylamine, borane-N—N,diethylaniline, and diluted solutions thereof.

In some CVD or PECVD silicon oxide deposition processes, the material properties of the deposited film may be determined by the surface assembly of gas phase generated (O—Si—O)$_x$ oligomers. Lattice mismatches and ligand contaminants may be incorporated into the film during the deposition process. This may lead to electrical degradation of the film and to undesirable physical characteristics, such as low film stress, high wet etch rate, and high film porosity.

In contrast, because the reactive plasma of plasma-activated CFD processes may deliver reactive species throughout the adsorbed layer of surface active species, the fractional conversion of the surface active species may approach unity. Moreover, the reactive species may heal lattice mismatches and scavenge film contaminants. Thus, in addition to the conformality advantages provided by plasma-activated CFD processes, plasma-activated CFD processes may potentially provide comparatively higher quality films with respect to those deposited by some CVD or PECVD approaches.

Figure 3:
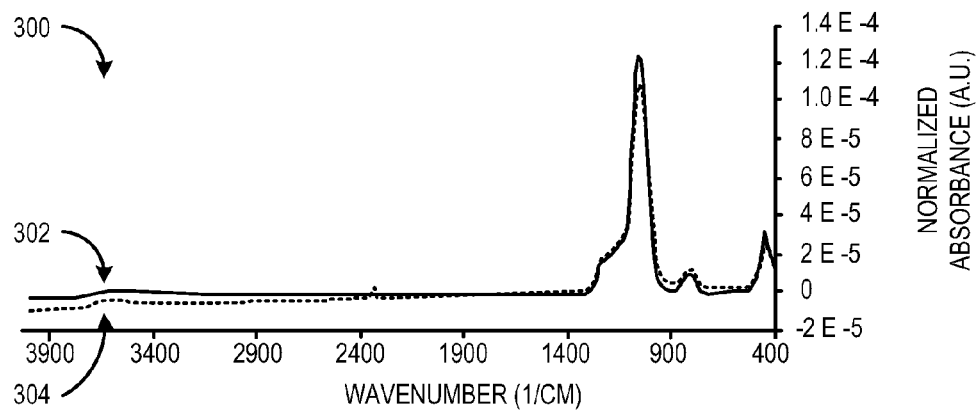
FIG. 3 shows a comparison of Fourier-transform infrared spectra between an example plasma-activated CFD silicon oxide film in accordance with an embodiment of the present disclosure and an example PECVD silicon oxide film.

As an example of this, FIGS. 3-5, discussed in detail below, illustrate a comparison of an example plasma-activated CFD $SiO_2$ film deposited at 180° C. with an $SiO_2$ film deposited by a TEOS-based PECVD process at the same temperature. FIG. 3 shows a comparison 300 of Fourier-transform infrared (FTIR) spectra for the example plasma-activated CFD film and the example PECVD film. Plasma-activated CFD FTIR spectrum 302 exhibits an $SiO_2$ peak at approximately 1065 cm$^{-1}$ that is more intense than that of PECVD FTIR spectrum 304. Because peak intensity is proportional to concentration, comparison 300 indicates that the plasma-activated CFD film may include a higher concentration of $SiO_2$, suggesting that the plasma-activated CFD film may have a higher density and less defective lattice than the PECVD film.

Figure 4:
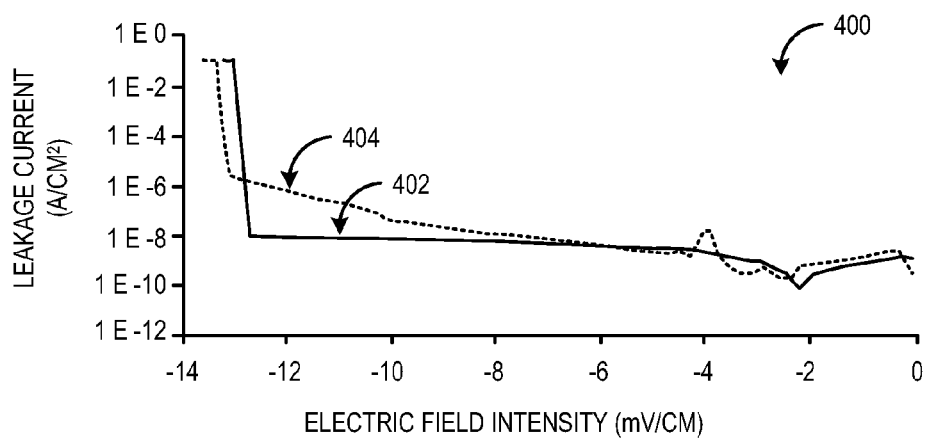
FIG. 4 shows a comparison of leakage current between an example plasma-activated CFD silicon oxide film in accordance with an embodiment of the present disclosure and an example PECVD silicon oxide film.

FIG. 4 shows a comparison 400 of leakage current for the example plasma-activated CFD film and the example PECVD film. Leakage current measurements at varying electric field intensities were performed using a mercury probe. Plasma-activated CFD leakage current trace 402 exhibits a lower, more stable leakage current over a range electric field intensity compared to PECVD leakage current trace 404. This suggests that the plasma-activated CFD film may be less contaminated and/or less defective than the PECVD film.

Figure 5:
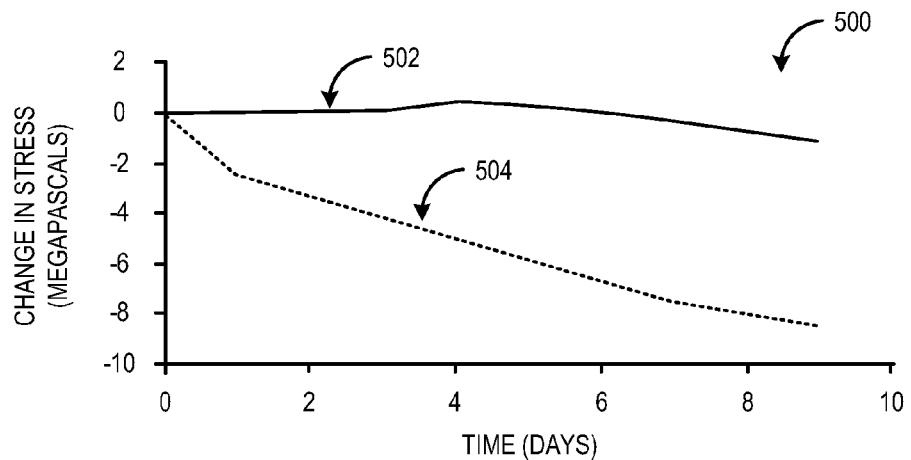
FIG. 5 shows a comparison of stress drift between an example plasma-activated CFD silicon oxide film in accordance with an embodiment of the present disclosure and an example PECVD silicon oxide film.

FIG. 5 shows a comparison 500 of stress drift for the example plasma-activated CFD film and the example PECVD film. Stress measurements taken during successive days of air exposure indicate that film stress for the plasma-activated CFD film, represented by trace 502, is more stable than film stress for the PECVD film, represented by trace 504. Thus, the plasma-activated CFD film may be less susceptible to ambient conditions, such as humidity, than the PECVD film.

It will be appreciated that the plasma-activated CFD process described above is a non-limiting example, and that suitable variation and/or omission of some portions of the above-described process is within the scope of the present disclosure.

For example, in some embodiments, one or more of the physical and electrical properties of the thin conformal film deposited by a plasma-activated CFD process may be adjusted by adjusting one or more process parameters for the cracking phase. In some embodiments, process parameters related to the cracking plasma may be adjusted to vary the deposition rate of the thin conformal film. For example, it will be appreciated that, for some plasmas, various species of precursor radicals generated by the plasma may have different species lifetimes, so that some precursor radical species decompose comparatively faster than others. Thus, for some precursor radical species, an initial concentration of some radical species may decrease from a first, higher concentration before consumption of the radicals by lifetime and adsorption events, to a lower equilibrium concentration formed by a steady-state balance between generation and adsorption. Further, because the cross-section of precursor radical species generated may be a function of the electron temperature of the plasma, variation in the electron energy of the plasma over time caused by electron quenching may lead to a time-dependent variation in the generation of some precursor radicals. Thus, for some precursor radical species, a decay in plasma electron energy via quenching may reduce or terminate generation of those species over time.

Accordingly, in some embodiments, the cracking phase may comprise two or more plasma subphases interspersed with one or more non-plasma subphases. Such an approach may provide a comparatively higher concentration of precursor radicals under conditions where a transient concentration of precursor radicals during and shortly after plasma ignition exceeds a concentration of precursor radicals during steady-state plasma conditions.

Figure 6:
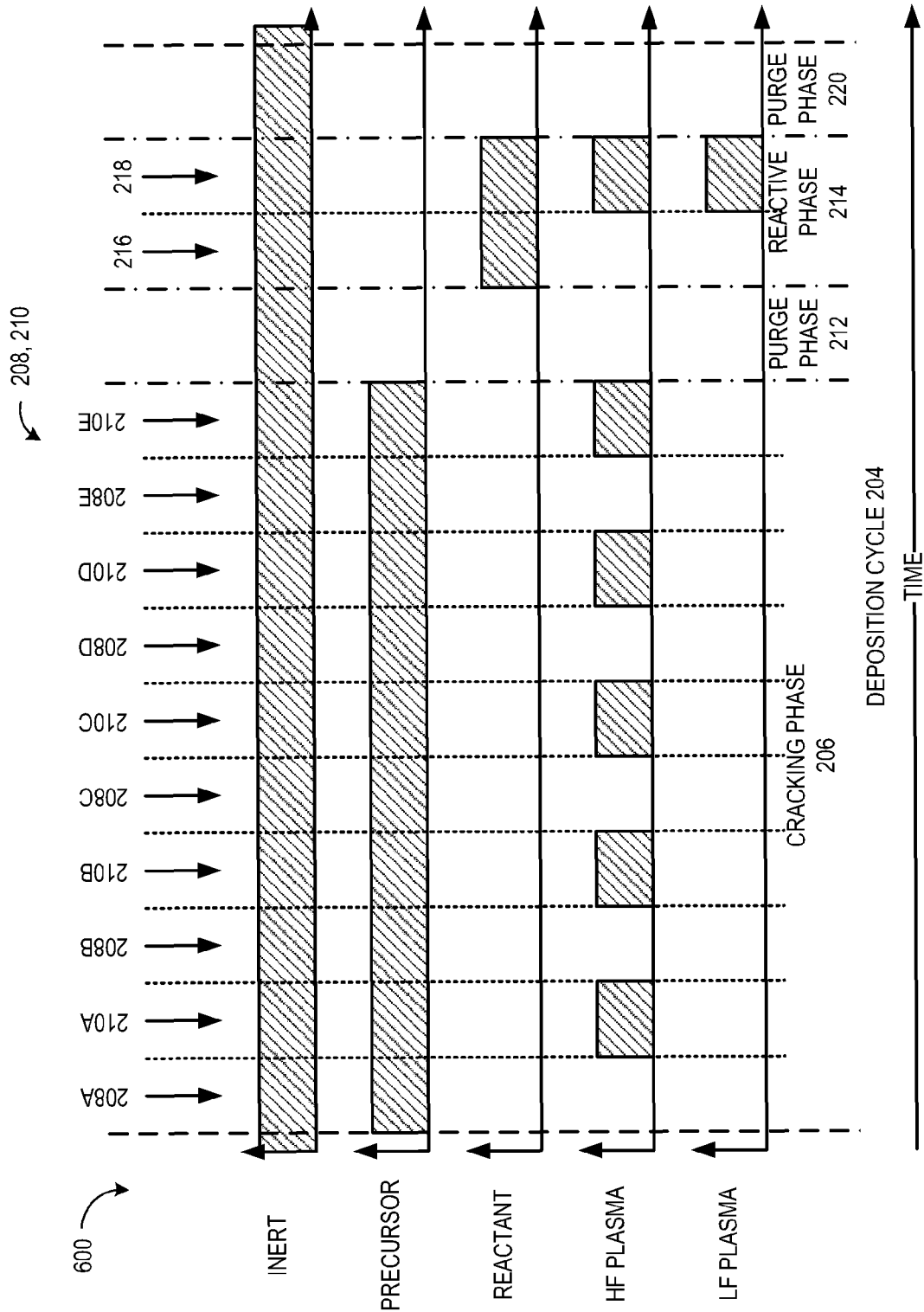
FIG. 6 shows another example process timing diagram for depositing a thin conformal film using a plasma-activated CFD process in accordance with an embodiment of the present disclosure.

For example, FIG. 6 shows a timing diagram 600 for an embodiment of a plasma-activated CFD process for depositing a thin conformal film. As shown in FIG. 6, timing diagram 600 comprises a series of process parameters arranged in a temporal sequence of process phases proceeding from left to right.

In the example shown in FIG. 6, cracking phase 206 includes a plurality of cracking plasma subphases 210 during which a high-frequency plasma is used to generate precursor radicals. The cracking plasma is extinguished at the end of each cracking plasma subphase 210. Each cracking plasma subphase 210 is separated from a subsequent cracking plasma subphase 210 by a pre-plasma precursor subphase 208, during which no plasma is generated. Thus, in the example shown in FIG. 6, cracking plasma subphase 210A is separated from cracking plasma subphase 210B by pre-plasma precursor subphase 208B. This arrangement provides a pulse of a high-frequency plasma.

Substituting a plurality of cracking plasma pulses for a single continuous cracking plasma provides an increased number of plasma ignition events. Without wishing to be bound by theory, this may provide a comparatively higher concentration of some precursor radicals throughout cracking phase 206, which may comparatively increase a concentration of corresponding surface active species at the substrate surface. In turn, a higher concentration of surface active species may potentially lead to a comparatively higher deposition rate.

Moreover, inclusion of one or more pre-plasma precursor subphases 208 may provide additional time for surface migration of surface active species. This may reduce or avoid the formation of discontinuous domains of surface active species, potentially providing comparatively more conformal films.

Any suitable number and duration of cracking plasma pulses may be employed within the scope of the present disclosure. Further, while the example shown in FIG. 6 includes a pre-plasma precursor subphase 208A prior to the first instance of a cracking plasma subphase 210, it will be appreciated that some embodiments may employ an opposite arrangement.

As introduced in the description of FIG. 2 above, some embodiments of plasma-activated CFD processes may vary the reactive phase instead of, or in addition to, varying in the cracking phase. For example, in some embodiments, the duration of the reactive plasma subphase may be adjusted to adjust physical and/or electrical film properties.

Additionally or alternatively, in some embodiments, the reactive phase may include suitable plasma pulsing schemes. For example, while the example reactive phase 214 shown in FIG. 2 depicts concurrent use of high- and low-frequency plasmas during reactive plasma subphase 218, in some examples, the high- and low-frequency plasmas may have an alternating sequence. For similar reasons to those explained above, providing additional plasma ignition events during the reactive phase may increase the concentrations of some reactant radical species.

Figure 7:
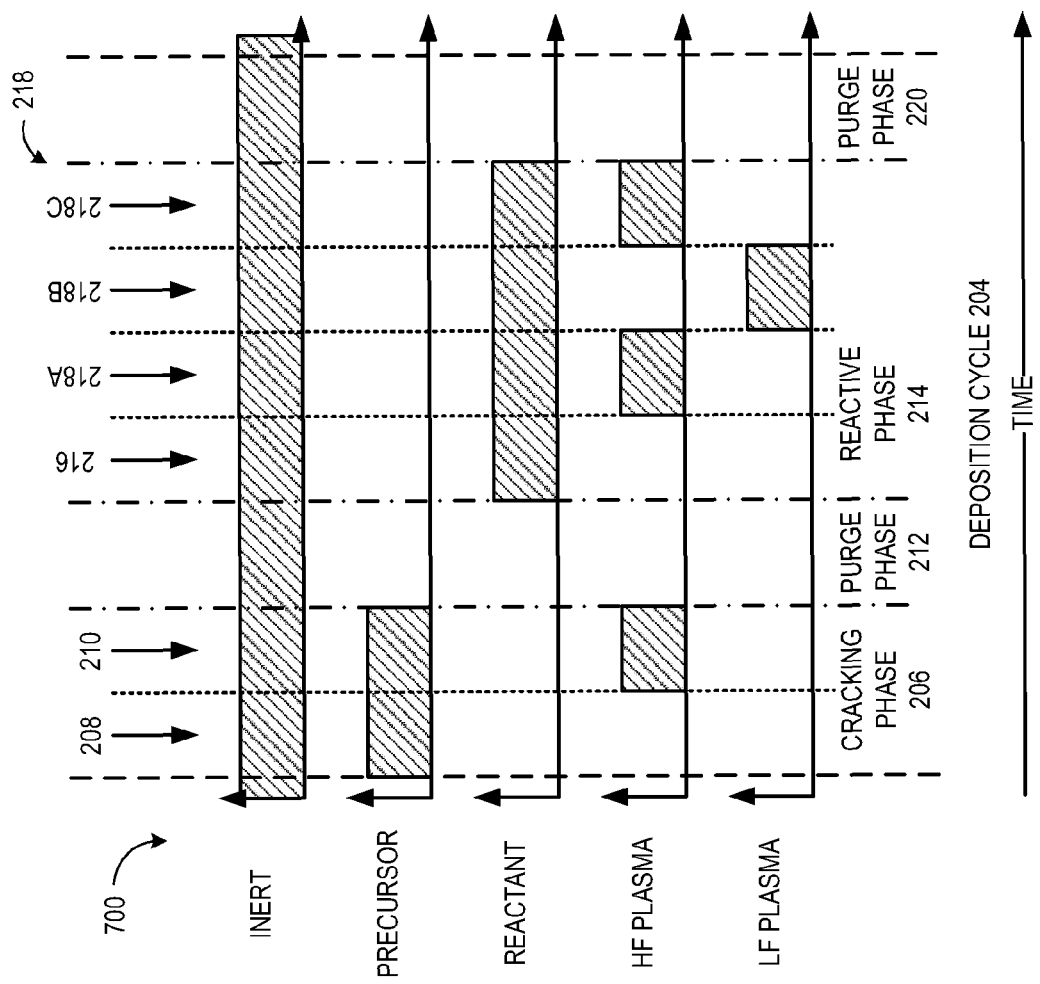
FIG. 7 shows another example process timing diagram for depositing a thin conformal film using a plasma-activated CFD process in accordance with an embodiment of the present disclosure.

For example, FIG. 7 shows a timing diagram 700 for an embodiment of a plasma-activated CFD process for depositing a thin conformal film. As shown in FIG. 7, timing diagram 700 comprises a series of process parameters arranged in a temporal sequence of process phases proceeding from left to right.

In the example shown in FIG. 7, reactive phase 214 comprises a sequence of reactive plasma subphases 218A-C. As shown in FIG. 7, a high-frequency plasma subphase 218A is followed by a low-frequency plasma subphase 218B and another high-frequency plasma subphase 218C. Such sequenced approaches may comparatively increase the generation of atomic oxygen species during high-frequency plasma subphases and comparatively enhance delivery of those species to the substrate surface during the low-frequency plasma subphases.

It will be appreciated that, in some embodiments, the example sequence of reactive plasma subphases 218 shown in FIG. 7 may be extended by any suitable number of high- and low-frequency plasma subphases and that reactive plasma subphases 218 may have any suitable duration. Further, it will be appreciated that, in some embodiments, a dual-frequency plasma subphase comprising a concurrent high- and low-frequency plasma may alternate with a single-frequency plasma subphase comprising either a high-frequency or a low-frequency plasma during reactive phase 214.

The example cracking phases and reactive phases described above may be used to deposit various thin conformal films. In one non-limiting example, a plasma-activated CFD process may be used to deposit a silicon oxide film from a precursor including TEOS and a reactant including oxygen. Non-limiting film property information for $SiO_2$ films formed from plasma-activated CFD processing of TEOS and oxygen at 180° C. is provided in Tables 3 and 4.

TABLE 3

| No. of TEOS plasma pulses | Duration of single $O_2$ plasma pulse (sec) | Dep. Rate (Å/cyc.) | Thick. (Å) | Range R (%) | 1σ (%) | Ref. Index RI | ν (%) | Stress (MPa) |
|---|---|---|---|---|---|---|---|---|
| 1 pulse | 1 | 3.8 | 1000 | 2.1 | 1.0 | 1.469 | 0.03 | −290 |
| 3 pulses | 1 | 8.4 | 1006 | 2.7 | 1.6 | 1.461 | 0.06 | −161 |
| 3 pulses | 2 | 8.5 | 1015 | 2.0 | 1.1 | 1.467 | 0.07 | −272 |
| 5 pulses | 1 | 15.2 | 912 | 2.2 | 1.5 | 1.461 | 0.04 | −131 |
| 5 pulses | 2 | 14.8 | 889 | 1.7 | 1.2 | 1.462 | 0.10 | −134 |
| 5 pulses | 3 | 15.0 | 899 | 1.6 | 0.8 | 1.465 | 0.04 | −202 |

TABLE 4

| No. of TEOS plasma pulses | Duration of single $O_2$ plasma pulse (sec) | k (Hg) | Leakage Current (A/cm²) @ 1 MV/cm | @ 2 MV/cm | @ 4 MV/cm | Breakdown Voltage (MV/cm) |
|---|---|---|---|---|---|---|
| 1 pulse | 1 | 4.5 | 9.4E−10 | 2.2E−10 | 2.3E−9 | −12.7 |
| 3 pulses | 1 | 4.5 | 8.9E−10 | 3.4E−9 | 5.6E−9 | −10.6 |
| 3 pulses | 2 | 4.4 | 3.5E−10 | 4.5E−10 | 2.6E−9 | −12.5 |
| 5 pulses | 1 | 6.3 | 1.9E−8 | 4.8E−7 | 1.9E−4 | −5.8 |
| 5 pulses | 2 | 4.5 | 6.9E−10 | 3.6E−10 | 4.1E−9 | −12.5 |
| 5 pulses | 3 | 4.5 | 8.9E−10 | 1.6E−10 | 2.2E−9 | −13.2 |

Figure 8:
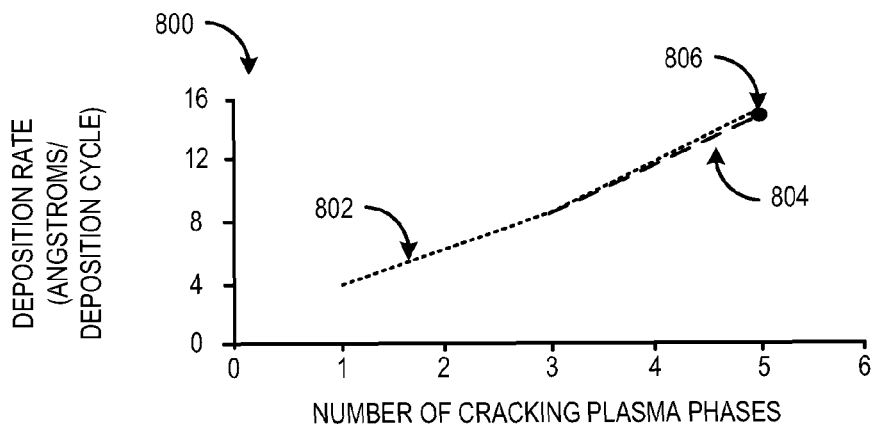
FIG. 8 shows a comparison of deposition rate between example plasma-activated CFD silicon oxide films as a function of a number of cracking plasma subphases in accordance with an embodiment of the present disclosure.
Figure 9:
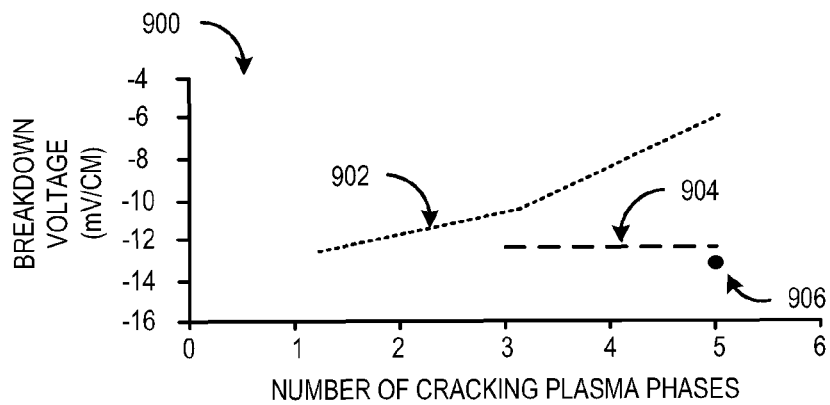
FIG. 9 shows a comparison of breakdown voltage between example plasma-activated CFD silicon oxide films as a function of a number of cracking plasma subphases in accordance with an embodiment of the present disclosure.
Figure 10:
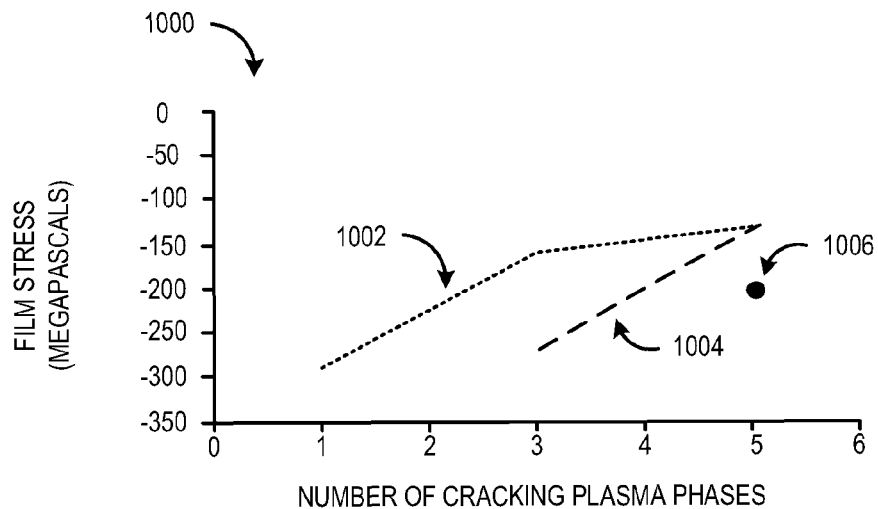
FIG. 10 shows a comparison of film stress between example plasma-activated CFD silicon oxide films as a function of a number of cracking plasma subphases in accordance with an embodiment of the present disclosure.

FIGS. 8-10, discussed in detail below, illustrate comparisons between example plasma-activated CFD $SiO_2$ having one or more TEOS cracking plasma subphases and having oxygen plasma phases of differing durations as set forth in Tables 3 and 4. The plasma-activated CFD films presented in FIGS. 8-10 were deposited at 180° C. using a variable number of TEOS cracking plasma subphases of 0.5 seconds each and using a single oxygen reactive plasma subphase of between one and three seconds each.

FIG. 8 shows a deposition rate comparison 800 for the plasma-activated CFD processes described above. Deposition rate trace 802 shows the dependence of deposition rate on the number of TEOS cracking plasma subphases for plasma-activated CFD processes having a one-second oxygen reactive plasma subphase. Deposition rate trace 804 shows the dependence of deposition rate on the number of TEOS cracking plasma subphases for plasma-activated CFD processes having a two-second oxygen reactive plasma subphase. A comparison of traces 802 and 804 indicates that the deposition rate is approximately linearly dependent on the number of TEOS plasma subphases, suggesting that the process is approximately first-order with respect to a concentration of TEOS precursor radicals generated in the cracking phase. A comparison of traces 802 and 804 also indicates that the deposition rate is substantially independent of the duration of the reactive oxygen plasma subphase. Deposition rate data point 806, showing the deposition rate for a plasma-activated CFD process having a three-second oxygen reactive plasma subphase and five TEOS cracking subphases, is consistent with these indications.

While the deposition rate for the example plasma-activated CFD silicon oxide films appears substantially independent of the duration of the reactive oxygen plasma subphase, variation of the duration of the reactive oxygen plasma subphase may affect electrical properties of those films. FIG. 9 shows a breakdown voltage comparison 900 for the plasma-activated CFD processes described above. Breakdown voltage trace 902 shows the dependence of breakdown voltage on the number of TEOS cracking plasma subphases for plasma-activated CFD processes having a one-second oxygen reactive plasma subphase. Breakdown voltage trace 902 indicates that extending the number of TEOS cracking plasma subphases without extending the duration of the oxygen reactive plasma subphases causes the breakdown voltage of the films to increase. Breakdown voltage trace 904 shows the dependence of breakdown voltage on the number of TEOS cracking plasma subphases for plasma-activated CFD processes having a two-second oxygen reactive plasma subphase. Breakdown voltage trace 904 suggests that lower breakdown voltage values may be recovered by extending the duration of the reactive oxygen plasma. Breakdown voltage data point 906, showing the breakdown voltage for a plasma-activated CFD process having a three-second oxygen reactive plasma subphase and five TEOS cracking plasma subphases, is consistent with these observations.

Variation of the duration of the reactive oxygen plasma subphase may also affect the physical properties of the example plasma-activated CFD silicon oxide films discussed above. FIG. 10 shows a film stress comparison 1000 for the plasma-activated CFD processes described above. Film stress trace 1002 shows the dependence of film stress on the number of TEOS cracking plasma subphases for plasma-activated CFD processes having a one-second oxygen reactive plasma subphase. Film stress trace 1002 indicates that extending the number of TEOS cracking plasma subphases without extending the duration of the oxygen reactive plasma subphases may cause the film stress to become less compressive. Film stress trace 1004 shows the dependence of film stress on the number of TEOS cracking plasma subphases for plasma-activated CFD processes having a two-second oxygen reactive plasma subphase. Film stress data point 1006 shows the film stress for a plasma-activated CFD process having a three-second oxygen reactive plasma subphase and five TEOS cracking plasma subphases. Film stress trace 1004 and film stress data point 1006 suggest that more compressive film stress values may be achieved by extending the duration of the reactive oxygen plasma as the number of TEOS cracking plasma subphases increases.

While the film deposition, electrical, and physical properties described above relate to a plasma-activated CFD process for depositing silicon oxide films from TEOS and oxygen, it will be appreciated that the approaches described above may be applied to the deposition of other suitable films from any other suitable precursors and/or reactants without departing from the scope of the present disclosure.

Adjustment of physical and electrical film properties may also be achieved, in some embodiments, via one or more post-deposition film treatments. As introduced in the description of FIG. 2, post-deposition phase 222 may provide various plasma and/or thermal treatments for the deposited film. In some embodiments, post-deposition treatment may comprise further treatment with plasma and/or thermally activated reactant. In some embodiments, a treatment reactant including dopant heteroatoms may be incorporated into the deposited film via a doping plasma generated from a doping reactant. Thus, in a scenario where a silicon oxide film has been deposited, a nitrogen-containing treatment reactant may be used to dope the film with nitrogen, potentially generating a silicon oxynitride film; a carbon-containing treatment reactant may be used to dope the film with carbon, potentially generating a silicon oxycarbide film; and a boron-containing treatment reactant may be used to dope the film with boron, potentially generating a silicon oxyboride film.

Figure 11:
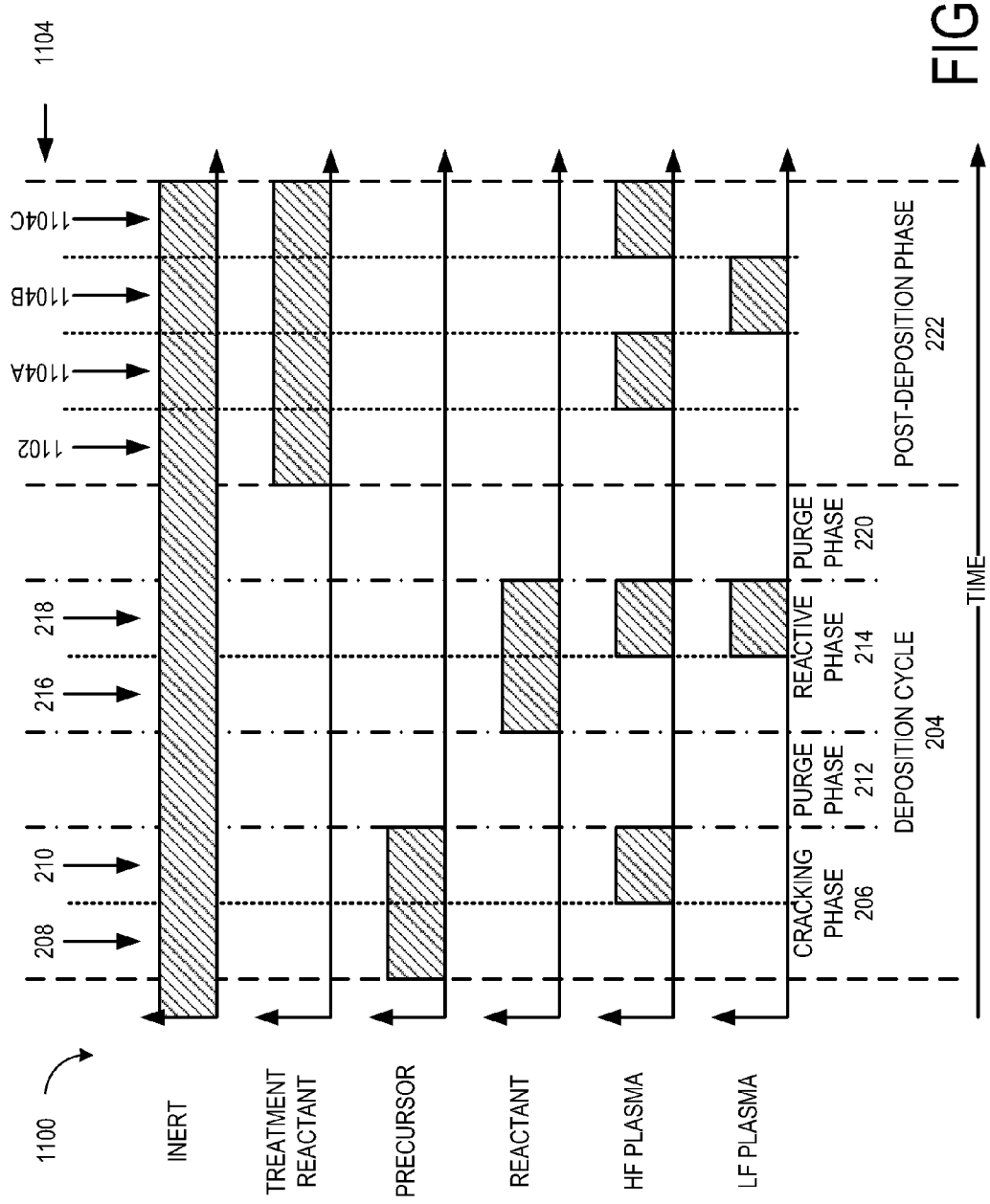
FIG. 11 shows another example plasma-activated CFD process timing diagram in accordance with an embodiment of the present disclosure.

For example, FIG. 11 shows a timing diagram 1100 for an embodiment of a plasma-activated CFD process for depositing a thin conformal film. As shown in FIG. 11, timing diagram 1100 comprises a series of process parameters arranged in a temporal sequence of process phases proceeding from left to right.

In the example shown in FIG. 11, post-deposition phase 222 includes a treatment pre-plasma subphase 1102 and a sequence of treatment plasma subphases 1104A-C. A treatment reactant and an inert gas are supplied to the process station at controlled rates during treatment pre-plasma subphase 1102. Treatment pre-plasma subphase 1102 may provide an opportunity for process station temperature and/or pressure to be adjusted to suitable film treatment conditions, and may provide an opportunity for a flow of the treatment reactant to stabilize.

While FIG. 11 depicts the treatment reactant and inert as having constant flow rates, it will be appreciated that any suitable controlled flow may be employed within the scope of the present disclosure. In one example, a treatment reactant and/or an inert may be supplied in a variable flow rate.

In the example shown in FIG. 11, treatment pre-plasma subphase 1102 is followed by a sequence of treatment plasma subphases 1104. As shown in FIG. 11, a high-frequency treatment plasma subphase 1104A is followed by a low-frequency treatment plasma subphase 1104B, which is followed by another high-frequency treatment plasma subphase 1104C. Sequencing treatment plasma subphases 1104 may comparatively increase the generation of treatment reactant species during high-frequency plasma subphases and comparatively enhance delivery of those species to the substrate surface during the low-frequency plasma subphases.

It will be appreciated that, in some embodiments, the example sequence of treatment plasma subphases 1104 shown in FIG. 11 may be extended by any suitable number of high- and low-frequency treatment plasma subphases or that treatment plasma subphases 1104 may comprise a single sequence of a high- and low-frequency treatment plasma subphases. In some embodiments, post-deposition phase 222 may comprise a single treatment plasma subphase 1104 including a high-frequency or a low-frequency treatment plasma, or concurrent high- and low-frequency treatment plasmas.

In some embodiments, a dual-frequency treatment plasma subphase comprising a concurrent high- and low-frequency plasma may alternate with a single-frequency treatment plasma subphase comprising either of a high-frequency or a low-frequency treatment plasma during post-deposition phase 222. Further, it will be appreciated that one or more treatment plasma subphases 1104 may have any suitable duration.

It will be appreciated that embodiments of the plasma-activated CFD processes described above may be used to deposit and treat thin conformal films at various points within an integrated manufacturing process flow. In some embodiments, plasma-activated CFD processes may be used to deposit thin conformal dielectric layers, such as liner layers, spacer layers, etch stop layers, hardmasks, and antireflective layers. In one specific embodiment described below, a silicon oxide film deposited via a plasma-activated CFD process may be used as a dielectric liner for a through-silicon via.

Through-silicon vias (TSVs) provide an approach to extending the processing capacity of semiconductor devices by stacking devices from a plurality of silicon substrates into a three-dimensional integrated device. Generally, one or more TSVs may be used to interconnect a plurality of die that have been thinned and bonded together in a stack. Thus, a packaged device may contain two or more traditional two-dimensional integrated devices electrically interconnected into a single three-dimensional device using TSVs.

Figure 12:
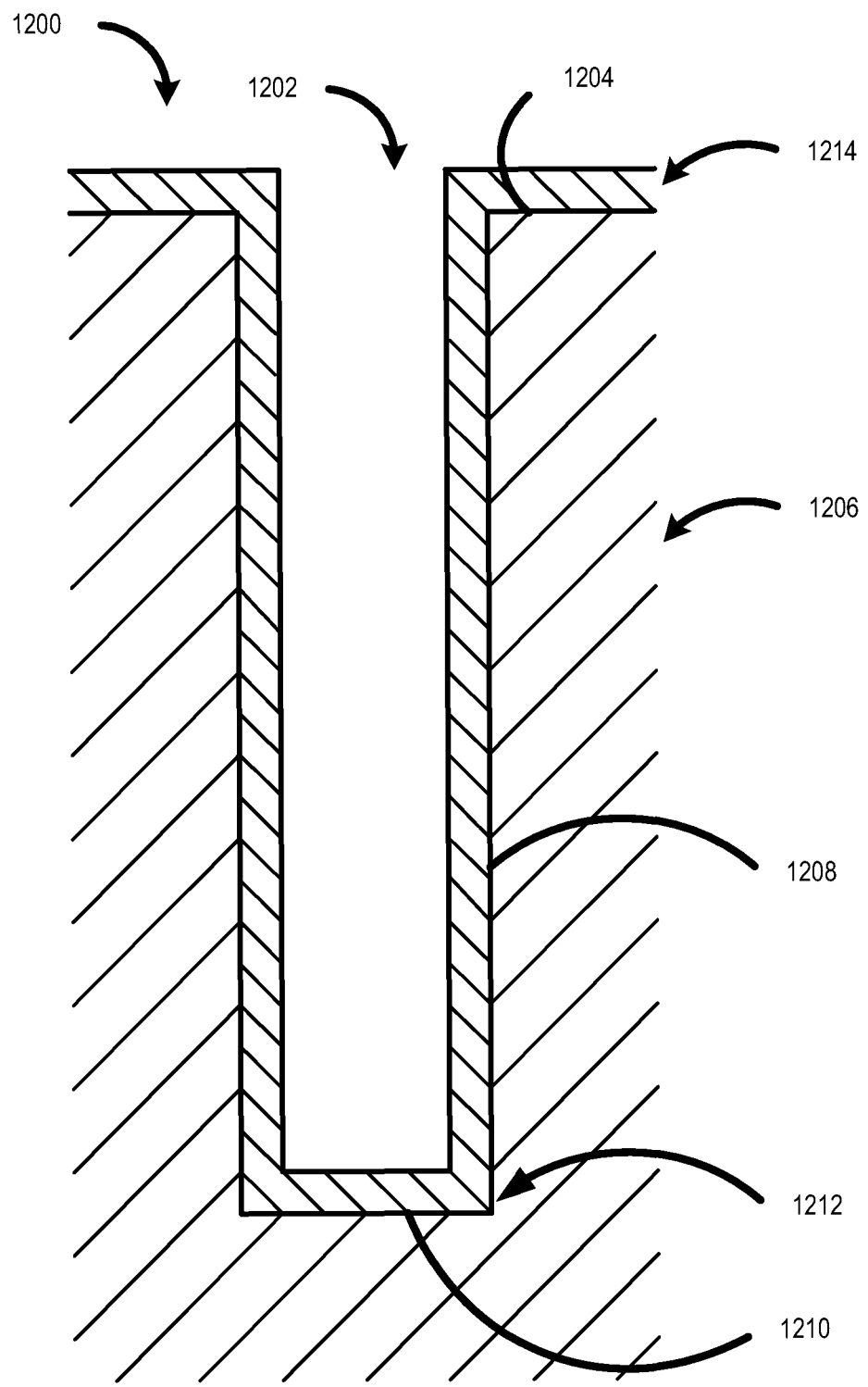
FIG. 12 shows an example cross section of a through-silicon via (TSV) comprising a thin conformal dielectric film deposited in accordance with an embodiment of the present disclosure.

FIG. 12 shows an example TSV 1200 comprising an opening 1202 in a top surface 1204 of a silicon substrate 1206. TSV 1200 also includes a sidewall 1208 extending inwardly from top surface 1204 and a bottom 1210. A plurality of bottom corners 1212 are formed where sidewall 1208 and bottom 1210 meet.

TSVs may be formed using plasma etch techniques. For example, TSV 1200 may be formed by reactive ion etching of silicon substrate 1206. TSVs are filled with a metal, such as copper, to effect electrical interconnection of the stacked substrates. Thus, TSV 1200 may be filled with copper (not shown) via any suitable metallization technique, such as an electrofill process or an electroless metallization process.

Because copper readily migrates within silicon, TSVs typically include a dielectric liner layer to electrically and physically insulate the silicon substrate from a copper TSV. As shown in FIG. 12, TSV 1200 includes a thin dielectric layer 1214 that covers sidewall 1208 and bottom 1210.

Since TSVs pass through integrated circuit architecture and penetrate the silicon substrate, design and/or manufacturing rules may determine where in the manufacturing process a TSV may be inserted. Thus, it will be appreciated that TSVs may be formed at various points within the front-end and/or the back-end a manufacturing process. Back-end processes typically are subject to temperature ceilings to avoid damaging metal interconnects. For example, thermal processing during an isolation layer deposition may be take place at less than 200° C. Thus, processes capable of forming and filling TSVs at comparatively lower temperatures may gain wider acceptance in manufacturing processes.

Because a TSV may extend through a substantial portion of the thickness of the silicon substrate, TSVs may exhibit aspect ratios of 10:1 or greater. For example, a TSV may have an opening of approximately 6 microns and a depth of approximately 60 microns. Some ALD approaches may be limited by deposition rate over such a large surface area, leading to lengthy deposition times. Some CVD approaches for depositing a dielectric isolation layer may be faster than some ALD processes, but some CVD approaches may be hindered by transport and kinetic barriers at these aspect ratios, potentially leading to thin coverage at the bottom corner of the TSV.

Accordingly, in some embodiments, plasma-activated CFD dielectric films may be deposited as a thin conformal liner layer in a TSV. As used herein, bottom corner coverage is defined as the thickness of the film measured at the bottom corner of the TSV divided by the thickness of the film measure in an open field, such as on the top surface of the substrate. Thus, the higher the bottom corner coverage percentage, the thicker the film at the bottom of the TSV, and thus the more conformal the film.

Figure 13:
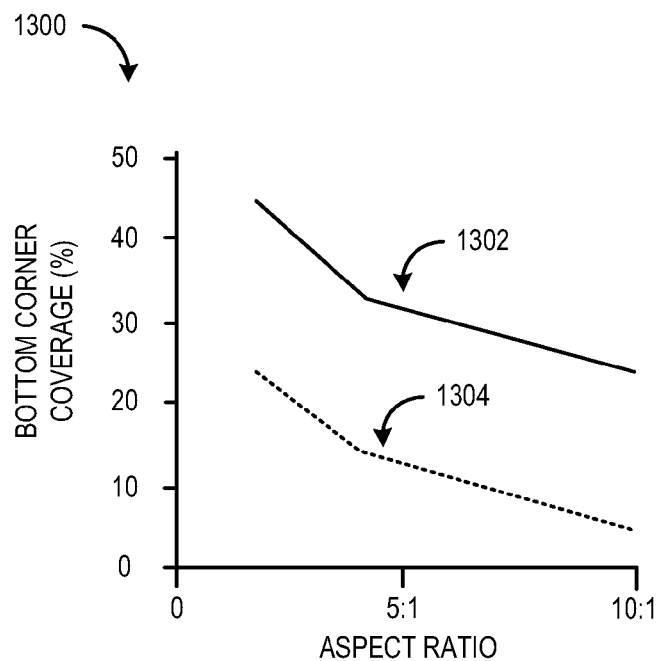
FIG. 13 shows a comparison of bottom corner coverage in a TSV between an example plasma-activated CFD silicon oxide film deposited at 180° C. in accordance with an embodiment of the present disclosure and an example PECVD silicon oxide film deposited at 180° C.

FIG. 13 shows a comparison 1300 of TSV bottom corner coverage percentages at different TSV aspect ratios. As shown in FIG. 13, example plasma-activated CFD $SiO_2$ films deposited using TEOS and oxygen at 180° C., represented by trace 1302, may consistently provide higher bottom corner coverage for aspect ratios of up to 10:1 when compared with example $SiO_2$ films deposited at the same temperature by some TEOS-based PECVD processes, represented by trace 1304. As shown in FIG. 13, an example plasma-activated CFD $SiO_2$ film deposited at 180° C. may provide approximately 25% bottom corner coverage in a TSV having a 10:1 aspect ratio. For the same aspect ratio, a PECVD $SiO_2$ film deposited at 180° C. may provide a bottom corner coverage of only approximately 6%.

Figure 14:
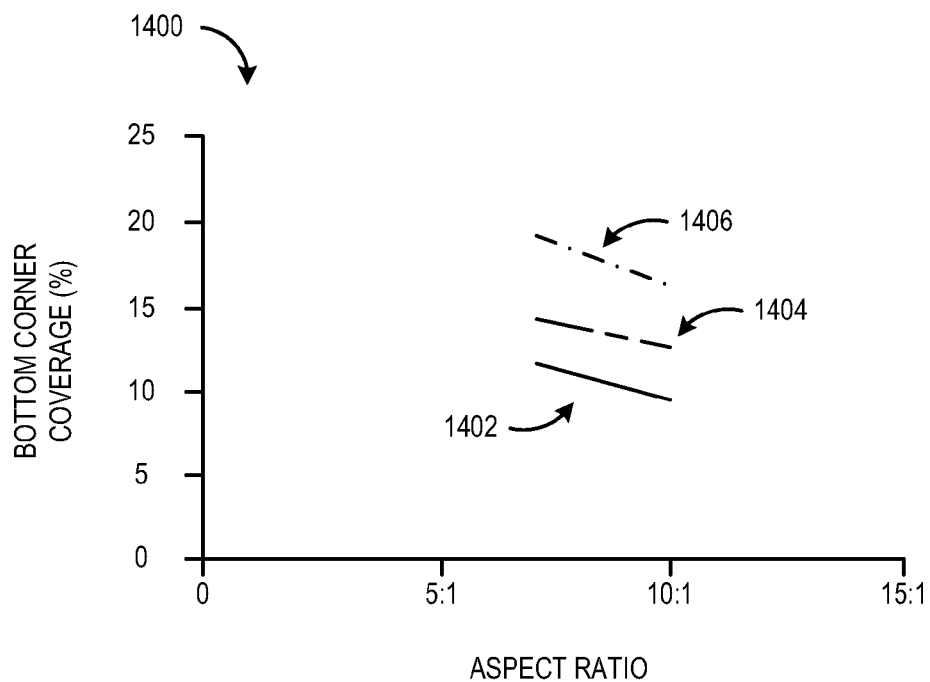
FIG. 14 shows a comparison of bottom corner coverage in a TSV between example plasma-activated CFD silicon oxide films deposited at 400° C. having different numbers of cracking plasma subphases as a function of aspect ratio in accordance with an embodiment of the present disclosure.

In some embodiments, plasma-activated CFD processes may also provide comparatively better step coverage than PECVD processes under higher temperature conditions like those that may occur earlier in a manufacturing process. FIG. 14 shows a comparison 1400 of TSV bottom corner coverage percentages for example plasma-activated CFD $SiO_2$ films having different numbers of cracking plasma subphases as a function of aspect ratio. Each film represented in FIG. 14 was deposited at 400° C.

While a comparison of FIGS. 13 and 14 shows that bottom corner coverage may decrease as the temperature of some example plasma-activated CFD $SiO_2$ film processes increases, the data presented in FIG. 14 suggest that bottom corner coverage at 400° C. may be increased by increasing the number of cracking plasma subphases during the deposition cycles. As shown in FIG. 14, for a TSV having a 10:1 aspect ratio, bottom corner coverage may increase from approximately 9% for an example plasma-activated CFD $SiO_2$ film deposited using a single cracking plasma phase during each deposition cycle (shown in coverage trace 1402) to approximately 12% for an example plasma-activated CFD $SiO_2$ film deposited using three cracking plasma subphases during each deposition cycle (shown in coverage trace 1404). Including five cracking plasma subphases in each deposition cycle may increase bottom corner coverage to approximately 17% (shown in coverage trace 1406) for some example plasma-activated CFD $SiO_2$ films. Thus, in some embodiments, increasing a number of cracking plasma subphases may comparatively increase bottom corner coverage for the deposited film.

Figure 15:
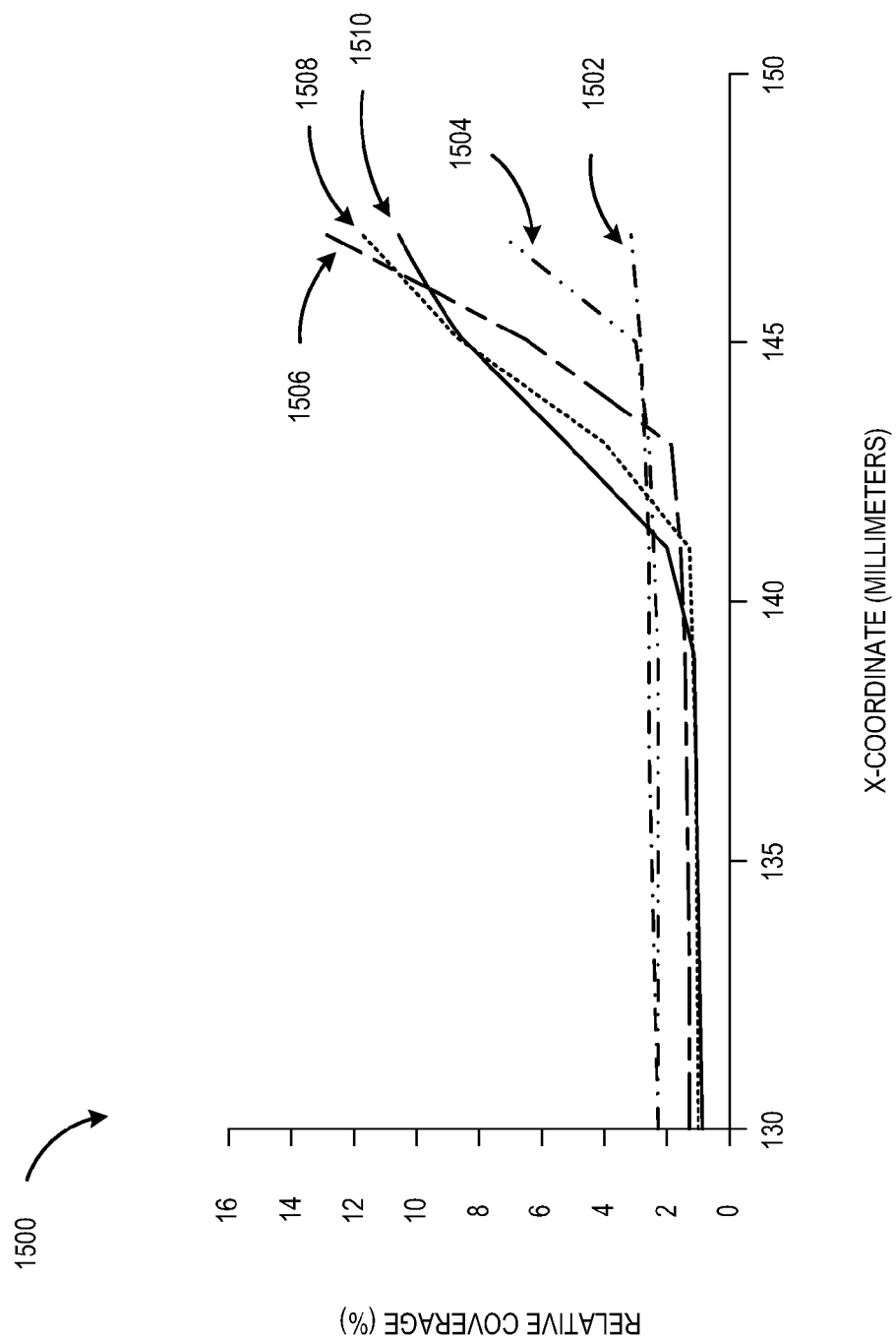
FIG. 15 shows a comparison of the coverage of substrate frontside film thickness relative to substrate backside film thickness for example plasma-activated CFD silicon oxide films deposited at 180° C. having different numbers of cracking plasma subphases in accordance with an embodiment of the present disclosure.

In some embodiments, including two or more cracking plasma subphases may also increase step coverage at lower process temperatures. FIG. 15 shows a comparison 1500 of the coverage of substrate frontside film thickness relative to substrate backside film thickness for example plasma-activated CFD silicon oxide films deposited at 180° C. and having a different number of cracking plasma subphases. As used herein, relative coverage is defined as the local backside film thickness divided by the front side edge thickness.

FIG. 15 shows relative coverage as a function of a radial position on an example 300-mm silicon wafer substrate, wherein 150 mm represents a position at the edge of the substrate and 0 mm represents the position of the center of the substrate. In some process stations, a substrate may rest on a substrate holder. Some process gases may diffuse within a small gap existing between the substrate and the substrate holder so that the deposited film may wrap around the substrate edge and extend inwardly along a portion of the substrate backside. Thus, measuring the extent to which a backside film extends inwardly from the edge may approximate the step coverage characteristics of a film deposition process.

In some embodiments, increasing the number of cracking plasma subphases in each deposition cycle may increase backside film deposition, so that more film may wrap around the substrate edge and so that the film may extend farther in from the substrate edge. As shown in FIG. 15, little backside film deposition may result from a plasma-activated CFD $SiO_2$ process having a single cracking plasma subphase in each deposition cycle, as shown in trace 1502. Continuing with the example shown in FIG. 15, including two cracking plasma subphases in each deposition cycle (trace 1504) may yield additional backside film at the wafer edge in some embodiments. Further, the data presented in FIG. 15 suggest that, in some examples, including three cracking plasma subphases in each deposition cycle (trace 1506) may increase the thickness of the backside film deposition at the edge and may increase an inward extension of backside film deposition. Continuing with the example illustrated in FIG. 15, in some embodiments, inward extension of backside film deposition may be further increased by including four or five cracking plasma subphases (traces 1508 and 1510, respectively) in each deposition cycle. Thus, in some embodiments, including two or more cracking plasma subphases may increase step coverage for the deposited film.

The deposition processes described above may be performed on any suitable process station. For example, a suitable process station may include hardware for accomplishing the processing operations and a system controller having instructions for controlling process operations in accordance with the present invention. In some embodiments, the hardware may include one or more process stations included in a process tool.

Figure 16:
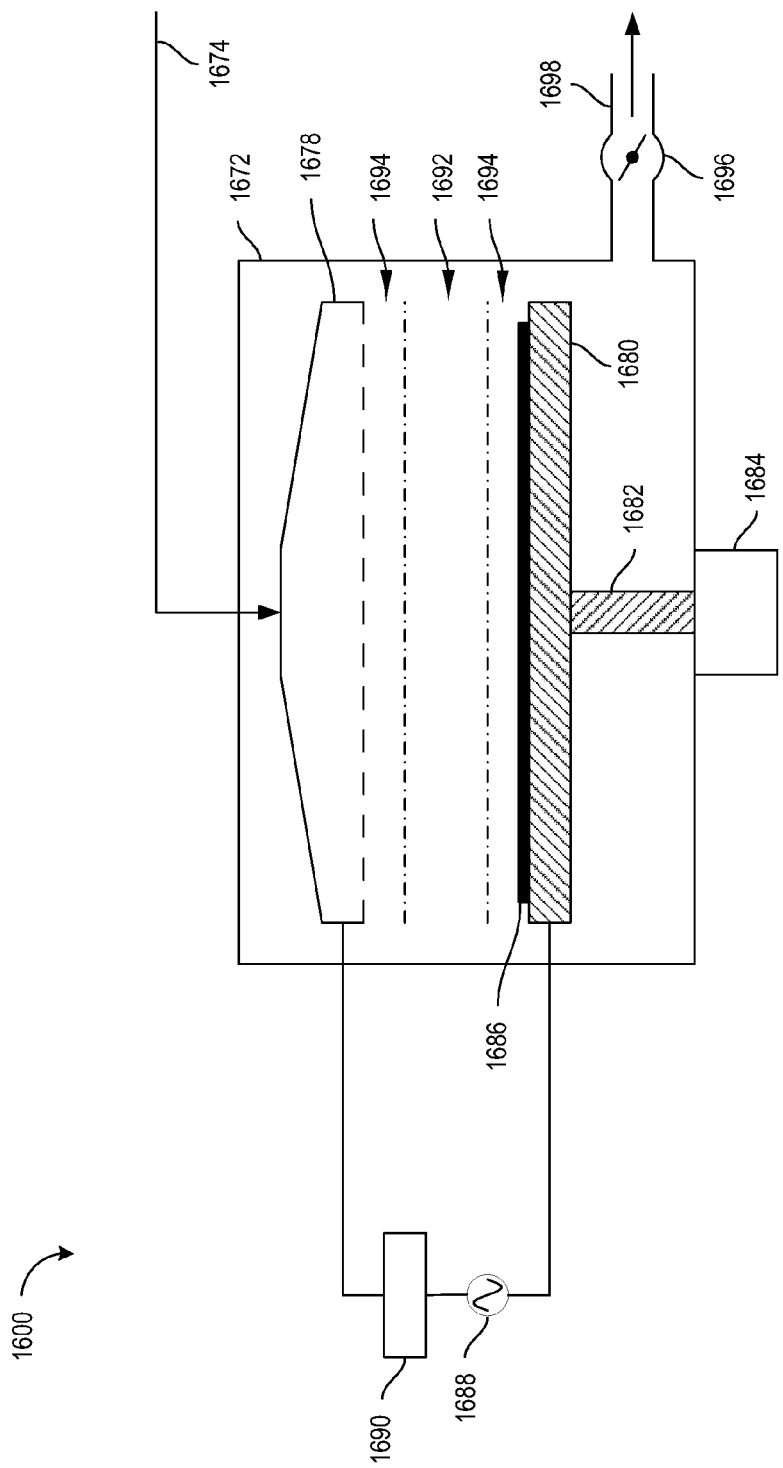
FIG. 16 shows an example process station for depositing a thin conformal film using a plasma-activated CFD process in accordance with an embodiment of the present disclosure.

FIG. 16 schematically shows an example process station 1600. For simplicity, process station 1600 is depicted as a standalone process station having a process chamber body 1672 for maintaining a low-pressure environment. However, it will be appreciated that a plurality of process stations 1600 may be included in a common low-pressure process tool environment. Process station 1600 includes a process gas delivery line 1674 for providing process gases, such as inert gases, precursors, reactants, and treatment reactants, for delivery to process station 1600. In the example shown in FIG. 16, a showerhead 1678 is included to distribute process gases within process station 1600. Substrate 1686 is located beneath showerhead 1678, and is shown resting on a holder 1680 supported by a pedestal 1682. In some embodiments, pedestal 1682 may be configured to rotate about a vertical axis. Additionally or alternatively, pedestal 1682 may be configured to translate horizontally and/or vertically.

In some embodiments, showerhead 1678 may be a dual-plenum or multi-plenum showerhead having a plurality of gas distribution hole sets. For example, a first set of gas distribution holes may receive gas from a first process gas delivery line and a second set of gas distribution holes may receive gas from a second process gas delivery line. Such physical isolation of process gases may provide an approach to reducing small particles generated from reactions of incompatible process gases in process gas delivery plumbing upstream of showerhead 1678.

Showerhead 1678 and holder 1680 electrically communicate with RF power supply 1688 and matching network 1690 for powering plasma 1692. Plasma 1692 may be contained by a plasma sheath 1694 located adjacent to showerhead 1678 and holder 1680. While FIG. 16 depicts a capacitively-coupled plasma, plasma 1692 may be generated by any suitable plasma source. For example, plasma 1692 may include one or more of a parallel plate plasma source, an inductively-coupled plasma source, a helicon wave plasma source, an electron cyclotron resonance plasma source, a magnetron-enhanced plasma source, and a direct current glow discharge plasma source.

In the embodiment shown in FIG. 16, RF power supply 1688 may provide RF power of any suitable frequency. In some embodiments, RF power supply 1688 may be configured to control high- and low-frequency RF power sources independently of one another. Example low-frequency RF powers may include, but are not limited to, frequencies between 200 kHz and 1000 kHz. Example high-frequency RF powers may include, but are not limited to, frequencies between 13.56 MHz and 80 MHz. Likewise, RF power supply 1688 and matching network 1690 may be operated at any suitable power to form plasma 1692. Examples of suitable powers include, but are not limited to, powers between 100 W and 3000 W for a high-frequency plasma and powers between 100 W and 10000 W for a low-frequency plasma. RF power supply 1688 may be operated at any suitable duty cycle. Examples of suitable duty cycles include, but are not limited to, duty cycles of between 5% and 90%.

In some embodiments, holder 1680 may be temperature controlled via heater 1684. Further, in some embodiments, pressure control for process station 1600 may be provided by butterfly valve 1696 or by any other suitable pressure control device. As shown in FIG. 16, butterfly valve 1696 throttles a vacuum provided by a vacuum pump (not shown) fluidly coupled to process station exhaust line 1698. However, in some embodiments, pressure control of process station 1600 may also be adjusted by varying a flow rate of one or more gases introduced to process station 1600.

As described above, one or more process stations may be included in a multi-station processing tool.

Figure 17:
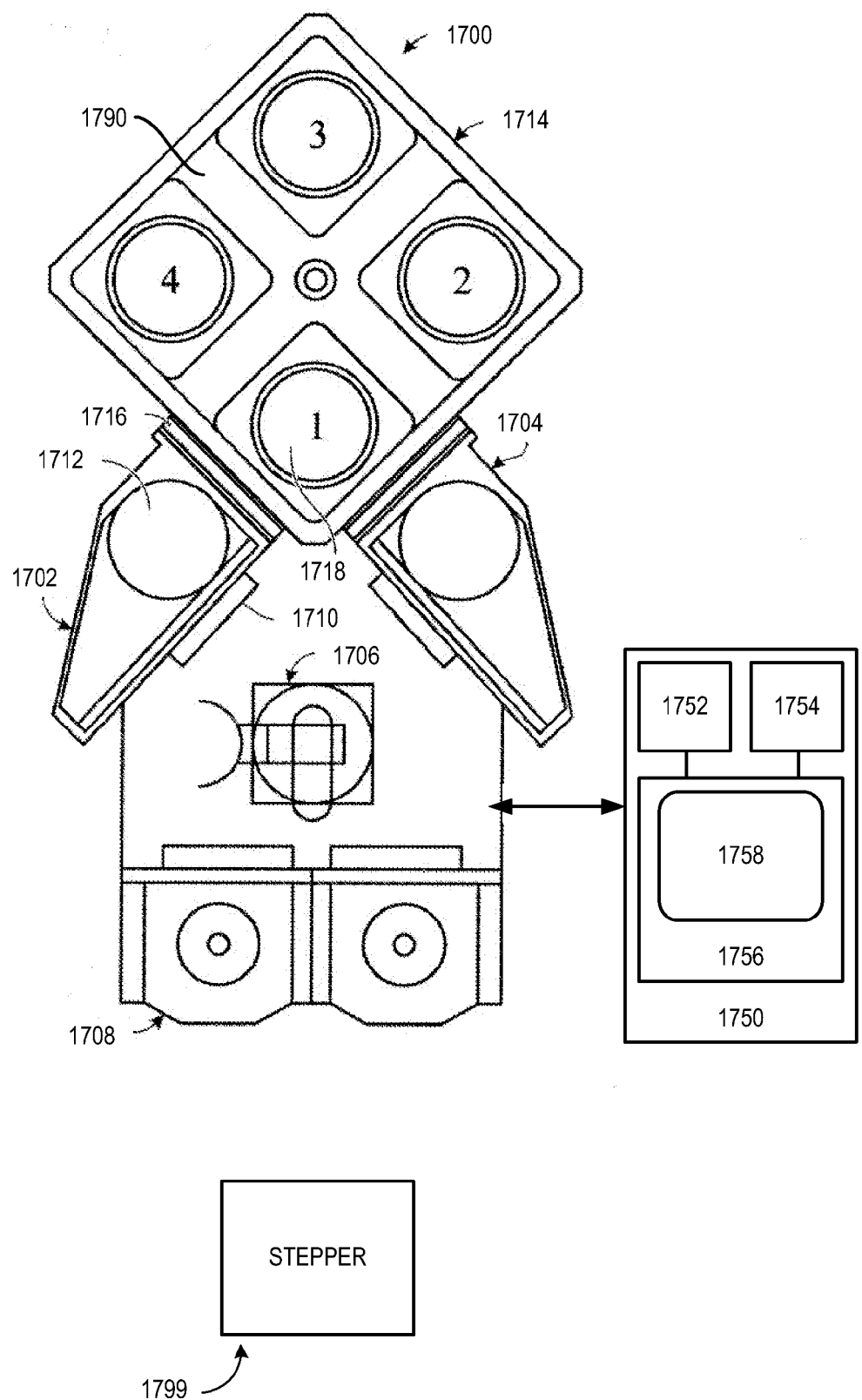
FIG. 17 shows an example process tool including a plurality of process stations and a controller in accordance with an embodiment of the present disclosure.

FIG. 17 shows a schematic view of an embodiment of a multi-station processing tool 1700 with an inbound load lock 1702 and an outbound load lock 1704. A robot 1706, at atmospheric pressure, is configured to move substrates from a cassette loaded through a pod 1708 into inbound load lock 1702 via an atmospheric port 1710. A substrate is placed by the robot 1706 on a load lock substrate holder 1712 in the inbound load lock 1702, the atmospheric port 1710 is closed, and the load lock is pumped down. Where the inbound load lock 1702 comprises a remote plasma source, the substrate may be exposed to a remote plasma treatment in the load lock prior to being introduced into a processing chamber 1714. Further, the substrate also may be heated in the inbound load lock 1702 as well, for example, to remove moisture and adsorbed gases.

Next, a chamber transport port 1716 to processing chamber 1714 is opened, and another robot (not shown) places the substrate into the reactor on a pedestal of a first process station for processing. While the embodiment depicted in FIG. 17 includes load locks, it will be appreciated that, in some embodiments, direct entry of a substrate into a process station may be provided.

The depicted processing chamber 1714 comprises four process stations, numbered from 1 to 4 in the embodiment shown in FIG. 17. Each station depicted in FIG. 17 includes a process station substrate holder (shown at 1718 for station 1) and process gas delivery line inlets. In some embodiments, one or more process station substrate holders 1718 may be heated.

In some embodiments, each process station may have different or multiple purposes. For example, a process station may be switchable between a plasma-activated CFD and PECVD process mode. Additionally or alternatively, in some embodiments, processing chamber 1714 may include one or more matched pairs of plasma-activated CFD and PECVD process stations. In another example, a process station may be switchable between two or more film types, so that stacks of different film types may be deposited in the same process chamber.

While the depicted processing chamber 1714 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 17 also depicts an embodiment of a substrate handling system 1790 for transferring substrates within processing chamber 1714. In some embodiments, substrate handling system 1790 may transfer substrates between various process stations and/or between a process station and a load lock. It will be appreciated that any suitable substrate handling system may be employed. Non-limiting examples include substrate carousels and substrate handling robots.

FIG. 17 also depicts an embodiment of a system controller 1750 employed to control process conditions and hardware states of processing tool 1700 so that the apparatus will perform a method in accordance with the present disclosure. System controller 1750 may include one or more memory devices 1756, one or more mass storage devices 1754, and one or more processors 1752. Processor 1752 may include a CPU or computer, analog and/or digital input/output connections, stepper motor controller boards, etc.

In some embodiments, system controller 1750 controls all of the activities of processing tool 1700. System controller 1750 executes machine-readable system control software 1758 stored in mass storage device 1754, loaded into memory device 1756, and executed on processor 1752. System control software 1758 may include instructions for controlling the timing, mixture of gases, chamber and/or station pressure, chamber and/or station temperature, substrate temperature, target power levels, RF power levels, substrate pedestal, chuck and/or susceptor position, and other parameters of a particular process performed by processing tool 1700. System control software 1758 may be configured in any suitable way. In some embodiments, various process tool component subroutines or control objects may be written to control operation of the process tool components for performing various process tool processes. For example, in some embodiments, the system controller may operate various valves, temperature controllers, plasma controllers, and pressure controllers to adjust process conditions within the apparatus. Further, in some embodiments, control and/or supply of various process inputs (e.g., process gases, plasma power, heater power, etc.) may be distributed from shared sources to a plurality of process stations included in the process tool. For example, in some embodiments, a shared plasma generator may supply plasma power to two or more process stations. In another example, a shared gas distribution manifold may supply process gases to two or more process stations.

System control software 1758 may be coded in any suitable computer readable programming language.

In some embodiments, system control software 1758 may include input/output control (IOC) sequencing instructions for controlling the various parameters described above. For example, each phase of a plasma-activated CFD process may include one or more instructions for execution by system controller 1750. The instructions for setting process conditions for a plasma-activated CFD process phase may be included in a corresponding plasma-activated CFD recipe phase. In some embodiments, the plasma-activated CFD recipe phases may be sequentially arranged, so that all instructions for a plasma-activated CFD process phase are executed concurrently with that process phase.

Other computer software and/or programs stored on mass storage device 1754 and/or memory device 1756 associated with system controller 1750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate holder 1718 and to control the spacing between the substrate and other parts of processing tool 1700.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 1750. The user interface may include a display screen, graphical software displays of the apparatus and/or process conditions, and user input devices such as pointing devices, keyboards, touch screens, microphones, etc.

In some embodiments, parameters adjusted by system controller 1750 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 1750 from various process tool sensors. The signals for controlling the process may be output on the analog and digital output connections of processing tool 1700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1750 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

FIG. 17 also shows an embodiment of a stepper 1799. Stepper 1799 may be used to expose a photoresist applied to the substrate to suitable light so that a pattern is transferred to the photoresist. In some embodiments, stepper 1799 may include other lithographic patterning processes as well (for example, the stepper may be configured to coat the substrate with photoresist, cure the photoresist, and develop the photoresist). Alternatively, in some embodiments, stepper 1799 may be used in combination with a suitable lithographic track tool configured to coat, cure, and develop the photoresist. Thus, in one example, stepper 1799 may be used to transfer a pattern to a substrate including a thin conformal film deposited by processing tool 1700. In another example, stepper 1799 may be used to transfer a pattern to a substrate before a thin conformal film is deposited by processing tool 1700. For example, a stepper may transfer a pattern for a through silicon via to the substrate. The through silicon via may be etched in the substrate according to the pattern, and the sidewalls and/or bottom of the through silicon via may subsequently be coated with a thin conformal film deposited by processing tool 1700.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Figure 18:
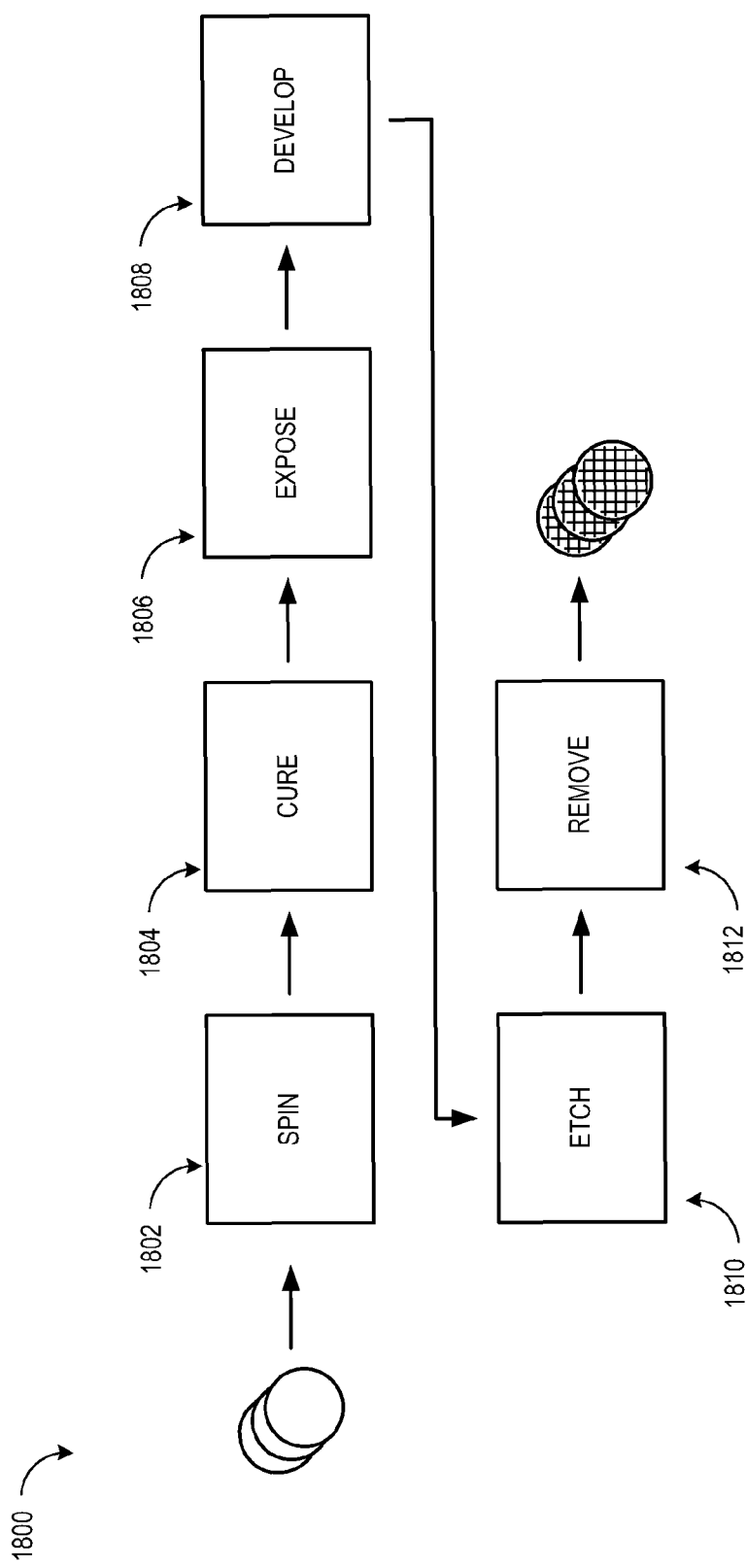
FIG. 18 shows a flow chart depicting an embodiment of a method of lithographic patterning in accordance with an embodiment of the present disclosure.

FIG. 18 shows a flow chart of an embodiment of a method 1800 of lithographic patterning, each step of which may be enabled with a number of possible tools. As shown in FIG. 18, method 1800 comprises, at 1802, applying photoresist on a workpiece (i.e. substrate) using, for example, a spin-on or spray-on tool. At 1804, method 1800 comprises curing of the photoresist using, for example, a hot plate or furnace or other suitable curing tool. At 1806, method 1800 comprises exposing the photoresist to visible or UV or X-ray light using, for example, a tool such as a wafer stepper. At 1808, method 1800 comprises developing the photoresist so as to selectively remove resist and thereby pattern it using, for example, a tool such as a wet bench or a spray developer. At 1810, method 1800 comprises transferring the resist pattern into an underlying film or workpiece by using, for example, a dry or plasma-assisted etching tool. At 1812, method 1800 comprises removing the resist using, for example, a tool such as an RF or microwave plasma resist stripper. In some embodiments, an ashable hardmask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method for processing a substrate, the method comprising:
    applying photoresist to the substrate;
    exposing the photoresist to light via a stepper;
    patterning the resist with a pattern and transferring the pattern to the substrate;
    selectively removing the photoresist from the substrate;
    placing the substrate into a process station of a semiconductor processing apparatus; and
    in the process station:
        in a first phase:
            generating precursor radicals off of a surface of the substrate, and
            adsorbing the precursor radicals to the surface to form surface active species,
        in a first purge phase, purging residual precursor from the process station,
        in a second phase, supplying a reactive plasma to the surface, the reactive plasma being configured to react with the surface active species and generate the thin conformal film, wherein the thin conformal film is selected from the group consisting of a silicon oxide film, a silicon nitride film, a silicon carbide film, and a silicon boride film, and
        in a second purge phase, purging residual reactant from the process station.

2. The method of claim 1, further comprising forming a substantially conformal layer of surface active species during the first phase.

3. The method of claim 1, wherein generating the precursor radicals further comprises generating precursor radicals in a gas phase with a high-frequency direct plasma.

4. The method of claim 1, further comprising adjusting a deposition rate for the thin conformal film by adjusting a duration of a high-frequency plasma during the first phase.

5. The method of claim 1, further comprising adjusting a deposition rate for the thin conformal film by adjusting a number of pulses of a high-frequency plasma during the first phase.

6. The method of claim 1, further comprising adjusting one or more of an electrical and a physical property of the thin conformal film by adjusting one or more of a plasma frequency and a plasma duration during the second phase.

7. The method of claim 1, wherein the second phase comprises generating the reactive plasma by using a high-frequency plasma and a low frequency plasma concurrently.

8. The method of claim 7, wherein generating the reactive plasma comprises pulsing the high-frequency plasma and the low-frequency plasma concurrently.

9. The method of claim 1, wherein the second phase comprises generating the reactive plasma by alternately pulsing a high-frequency plasma and a low frequency plasma.

10. The method of claim 1, further comprising, in a third phase, doping the thin conformal film with a dopant supplied by a doping plasma, wherein the doping plasma is generated with one or more of a high-frequency and a low-frequency plasma.

11. A method of forming a through-silicon via in a substrate, the method comprising:
    forming the through-silicon via, comprising:
        applying a photoresist to the substrate,
        exposing the photoresist to light,
        patterning the resist with a pattern and transferring the pattern to the substrate, and
        selectively removing the photoresist from the substrate; and
    forming a thin conformal dielectric layer covering a sidewall and a bottom of the through silicon via, comprising:
        in a first phase, generating precursor radicals away from the substrate and adsorbing the precursor radicals on the sidewall and bottom of the through-silicon via, in a first purge phase, purging residual precursor from the process station, in a second phase, supplying a reactive plasma to the sidewall and bottom of the through-silicon via, the reactive plasma configured to react with the precursor radicals adsorbed on the sidewall and bottom of the through-silicon via and to form a thin conformal dielectric layer, wherein the thin conformal dielectric layer is selected from the group consisting of a silicon oxide film, a silicon nitride film, a silicon carbide film, and a silicon boride film, and in a second purge phase, purging residual reactant from the process station.

12. The method of claim 11, wherein forming the thin conformal dielectric layer further comprises depositing the thin conformal dielectric layer in a bottom corner of the through-silicon via so that a bottom corner thickness of the thin conformal dielectric layer is at least approximately 10% of an open field thickness of the thin conformal dielectric layer, wherein the through-silicon via has an aspect ratio of at least approximately 10:1.

13. The method of claim 11, wherein the precursor radicals are generated from a precursor comprising tetraethyl orthosilicate.

14. The method of claim 11, wherein the reactive plasma comprises atomic oxygen radicals.

15. The method of claim 14, wherein forming the thin conformal dielectric layer further comprises forming a thin conformal dielectric layer having a compressive stress of at least approximately −131 MPa and a refractive index of at least approximately 1.46.

16. The method of claim 11, wherein the first phase comprises using a high-frequency plasma to generate the precursor radicals, and wherein the second phase comprises using one or more of a high-frequency plasma and a low-frequency plasma to generate the reactive species.

17. A method for processing a substrate, the method comprising:
applying photoresist to the substrate;
exposing the photoresist to light via a stepper;
patterning the resist with a pattern and transferring the pattern to the substrate;
selectively removing the photoresist from the substrate;
placing the substrate into a process station of a semiconductor processing apparatus; and
in the process station:
in a first phase:
generating precursor radicals off of a surface of the substrate, and
adsorbing the precursor radicals to the surface to form surface active species,
in a first purge phase, purging residual precursor from the process station,
in a second phase, supplying a reactive plasma to the surface, the reactive plasma being configured to react with the surface active species and generate the thin conformal film, wherein the second phase comprises generating the reactive plasma by alternately pulsing a high-frequency plasma and a low frequency plasma, and
in a second purge phase, purging residual reactant from the process station.

18. A method for processing a substrate, the method comprising:
in a first phase:
generating precursor radicals off of a surface of the substrate, and
adsorbing the precursor radicals to the surface to form surface active species,
in a first purge phase, purging residual precursor from the process station,
in a second phase, supplying a reactive plasma to the surface, the reactive plasma being configured to react with the surface active species and generate the thin conformal film, wherein the thin conformal film is selected from the group consisting of a silicon oxide film, a silicon nitride film, a silicon carbide film, and a silicon boride film, and
in a second purge phase, purging residual reactant from the process station.

* * * * *